(12) United States Patent
Uchida

(10) Patent No.: US 7,861,043 B2
(45) Date of Patent: Dec. 28, 2010

(54) SEMICONDUCTOR MEMORY DEVICE, SEMICONDUCTOR INTEGRATED CIRCUIT SYSTEM USING THE SAME, AND CONTROL METHOD OF SEMICONDUCTOR MEMORY DEVICE

(75) Inventor: Toshiya Uchida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 489 days.

(21) Appl. No.: 11/349,930

(22) Filed: Feb. 9, 2006

(65) Prior Publication Data

US 2007/0058451 A1 Mar. 15, 2007

(30) Foreign Application Priority Data

Sep. 9, 2005 (JP) ............................. 2005-261644

(51) Int. Cl.
*G06F 12/00* (2006.01)
*G06F 13/00* (2006.01)
*G06F 13/28* (2006.01)

(52) U.S. Cl. ..................... 711/154; 711/167; 365/233.1

(58) Field of Classification Search ................. 711/137, 711/101
See application file for complete search history.

(56) References Cited

U.S. PATENT DOCUMENTS

| | | | |
|---|---|---|---|
| 5,598,372 A | 1/1997 | Matsumoto et al. | |
| 6,049,490 A * | 4/2000 | Kawasumi | 365/189.07 |
| 6,108,746 A | 8/2000 | Fujita et al. | |
| 6,199,126 B1 * | 3/2001 | Auerbach et al. | 710/68 |
| 6,628,562 B2 | 9/2003 | Uchida et al. | |
| 6,650,582 B2 | 11/2003 | Matsumoto et al. | |
| 2001/0042143 A1 | 11/2001 | Ooba et al. | |
| 2004/0078527 A1 * | 4/2004 | Tetrick | 711/137 |
| 2005/0081014 A1 * | 4/2005 | Tran et al. | 711/213 |
| 2006/0190688 A1 * | 8/2006 | Van Eijndhoven et al. | 711/137 |

FOREIGN PATENT DOCUMENTS

| | | |
|---|---|---|
| CN | 1116763 A | 2/1996 |
| JP | 01-171191 | 7/1989 |
| JP | 08-305625 | 11/1996 |
| JP | 2003-208303 | 7/2003 |

\* cited by examiner

*Primary Examiner*—Brian R Peugh
*Assistant Examiner*—Prasith Thammavong
(74) *Attorney, Agent, or Firm*—Arent Fox LLP

(57) ABSTRACT

The invention relates to a semiconductor memory device and a semiconductor integrated circuit system using the same and a control method of a semiconductor memory device. An object of the invention is to provide a semiconductor memory device which reduces the number of accesses to decrease the burden on a control unit and facilitates circuit board design, a semiconductor integrated circuit system using the same, and a control method of a semiconductor memory device. The semiconductor memory device is configured to have a data input unit to which input data is inputted from outside, a memory unit which stores data, an operation unit which processes a predetermined operation on input data and read data read out from the memory unit, and a data output unit which outputs operation result data obtained at the operation unit to the outside.

17 Claims, 30 Drawing Sheets

SEMICONDUCTOR MEMORY DEVICE, SEMICONDUCTOR INTEGRATED CIRCUIT SYSTEM USING THE SAME, AND CONTROL METHOD OF SEMICONDUCTOR MEMORY DEVICE

BACKGROUND OF THE INVENTION

1. Field of the Invention

The present invention relates to a semiconductor memory device and a semiconductor integrated circuit system using the same, and a control method of a semiconductor memory device.

2. Description of the Related Art

In recent years, electronic devices such as DVC (digital video camera) and DSC (digital still camera), cellular telephones or the like, have made significant technological advances. In association therewith, there is a growing demand for increasing the size and definition of image handled in these electronic devices. Furthermore, in order to transmit image information over a communication network, a transmission line with a sufficiently broad bandwidth (broadband) is required. However, the capacity of a memory device mounted on these electronic devices has limitations, and the bandwidth of communication channels are limited, and thus attention is focused on the compression technology to suppress the bandwidth of data itself.

Compression of moving images has been conducted by splitting a screen into a plurality of blocks to detect differences (spatial redundancy) in images between adjacent blocks, or detecting differences (temporal redundancy) in motion of images between previous and subsequent frames to remove redundant portions. In H.264 (MPEG-4AVC) and the like, a highly advanced compression algorithm is adopted, and it is desired to improve the processing speed of compression devices.

| Patent Reference 1 | JP-A-2003-208303 |
| Patent Reference 2 | JP-A-08-305625 |
| Patent Reference 3 | JP-A-01-171191 |

In such moving image compression by removing redundant portions, since data of a plurality of blocks (or frames) is read out of image information written in a predetermined semiconductor memory device (semiconductor memory) to detect differences therebetween, access is made to the semiconductor memory device for many times. Thus, a problem arises that burden is increased on a control unit which controls the memory device. In order to process a large volume of data within a predetermined time period using an existing general purpose memory, there is no solution except that the operation frequency of the semiconductor memory device is increased to grow the number of times of processing per unit time. However, in this scheme, a problem arises that the design of a circuit board on which the semiconductor memory device, a control device, and the like to control the memory device are mounted becomes more difficult.

Patent Reference 1 discloses a semiconductor memory device which has an operation function unit for logical operation in every memory cell. Patent Reference 2 discloses a semiconductor memory with an operation function which operates data held in memory cells each other. Moreover, Patent Reference 3 discloses a storage element with an operation function which operates input data and data read out from a storage module, and supplies the resulting operation result data again to the storage module. However, none of the patent References disclose a technique that reduces the number of accesses to decrease the burden on the control unit and facilitates circuit board design.

SUMMARY OF THE INVENTION

An object of the invention is to provide a semiconductor memory device which reduces the number of accesses to decrease the burden on a control unit, and a semiconductor integrated circuit system using the same, and a control method of a semiconductor memory device.

The above object can be achieved by a semiconductor memory device including:

a data input unit to which input data is inputted from an outside;

a memory unit in which data is stored;

an operation unit processing a predetermined operation with the input data and read data read out from the memory unit; and a data output unit outputting operation result data obtained by the operation unit to the outside.

Furthermore, the above object can be achieved by a control method of a semiconductor memory device including the steps of:

storing in a memory unit a first data inputted from an outside in association with a non-operation command that does not permit an operation unit to operate;

inputting from the outside a second data associated with an operation command that permits the operation unit to process a predetermined operation;

based on the operation command, operating the second data and the first data read out from the memory unit at the operation unit; and outputting operation result data obtained by the operation after a predetermined time period has elapsed from the input of the operation command inputted.

Moreover, the above object can be achieved by a semiconductor integrated circuit system which compresses elementary information and instruction information created by using decompression target information obtained from the elementary information and compression target information to create compressed information, and decompresses the compression target information by decompressing the decompression target information created from the instruction information extracted from the compress information, wherein any of the semiconductor memory devices according to the invention is used for:

creating the decompression target information by operating the compression target information inputted in association with the non-operation command and the elementary information inputted in association with the operation command; and decompressing the compression target information by operating the decompression target information extracted from the compressed information and inputted in association with the non-operation command and the elementary information inputted in association with the operation command.

According to the invention, a semiconductor memory device which reduces the number of accesses to decrease the burden on a control unit and facilitates circuit board design, and a semiconductor integrated circuit system using the same can be implemented.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Figure 1:
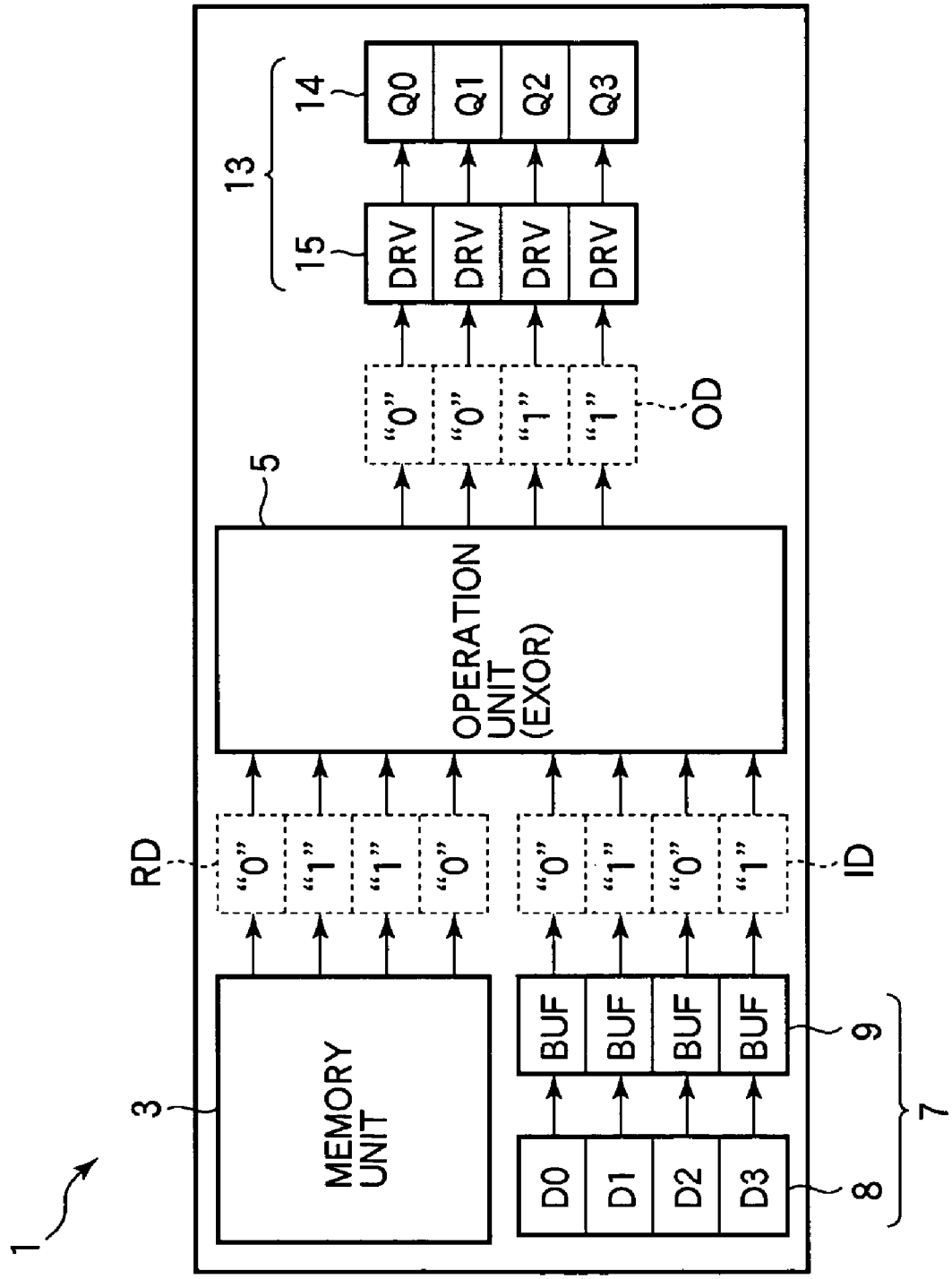
FIG. 1 is a diagram illustrating the basic principle of a semiconductor memory device 1 of an embodiment according to the invention.

A semiconductor memory device of an embodiment according to the invention, and a semiconductor integrated circuit system using the same, and a control method of a semiconductor memory device will be described with reference to FIGS. 1 to 30. First, the basic principle of the semiconductor memory device according to the embodiment will be described with reference to FIG. 1. FIG. 1 depicts the schematic configuration of a semiconductor memory device 1 of the embodiment. In FIG. 1, for facilitating the understanding, data inside the semiconductor memory device 1 is depicted by a broken line frame. In addition, from in FIG. 2 onward, data inside the semiconductor memory device 1 is also depicted in the similar manner.

As shown in FIG. 1, the semiconductor memory device 1 has a data input unit 7 to which input data ID is inputted from outside, a memory unit 3 which has a plurality of memory cells (not shown) to store data therein, an operation unit 5 which processes a predetermined operation for the input data ID inputted to the data input unit 7 and read data RD read out from the memory unit 3, and a data output unit 13 which outputs operation result data OD obtained at the operation unit 5 to the outside.

The data input unit 7 has a data input terminal 8 to which the input data ID is inputted from the outside, and an input data buffer 9 which temporarily stores the input data ID inputted to the data input terminal 8. The data input terminal 8 has four input terminals D0 to D3 for the input data ID.

The data output unit 13 has an output data driver 15 which outputs the operation result data OD obtained at the operation unit 5, and a data output terminal 14 which outputs the operation result data OD from the output data driver 15 to the outside. The data output terminal 14 has four output terminals Q0 to Q3 for the operation result data OD. Here, a four-bit data input/output terminal will be taken as an example to describe the invention, however, it may be fine to have the number of input terminals D0 to Dn−1 matched with the bit number n that is inputted in parallel from the outside and the number of data output terminals Q0 to Qn−1 matched with the bit number n that is outputted in parallel to the outside.

Next, the basic operation of the semiconductor memory device 1 will be described. The four-bit input data ID (for example, '0101') is inputted to the operation unit 5 through the data input unit 7 from the outside. The four-bit read data RD (for example, '0110') is read out from the memory unit 3 and inputted to the operation unit 5. The operation unit 5 processes an operation (for example, exclusive OR (EXOR)) for the input data ID and the read data RD, and outputs the four-bit operation result data OD (='0011') to the data output unit 13. The data output unit 13 outputs the operation result data OD to the outside.

As described above, since the semiconductor memory device 1 according to the basic principle of the embodiment has the operation unit 5 in the device, it can operate input data and predetermined data in the device without outputting the predetermined data stored in the memory unit 3 to the outside of the semiconductor memory device 1. Thus, the number of accesses to the semiconductor memory device 1 can be reduced to decrease the burden on a control unit which controls the semiconductor memory device 1. Furthermore, since the number of accesses to the semiconductor memory device 1 is reduced to increase through put per unit time, the operation frequencies of the semiconductor memory device 1 and the control unit can be lowered. Therefore, design of a circuit board on which the semiconductor memory device 1 is packaged can be facilitated. Moreover, since the semiconductor memory device 1 according to the basic principle directly transmits the operation result data OD to the data output unit 13 without storing it in the memory unit 3, the operation result data can be sequentially outputted at high speed.

Figure 2:
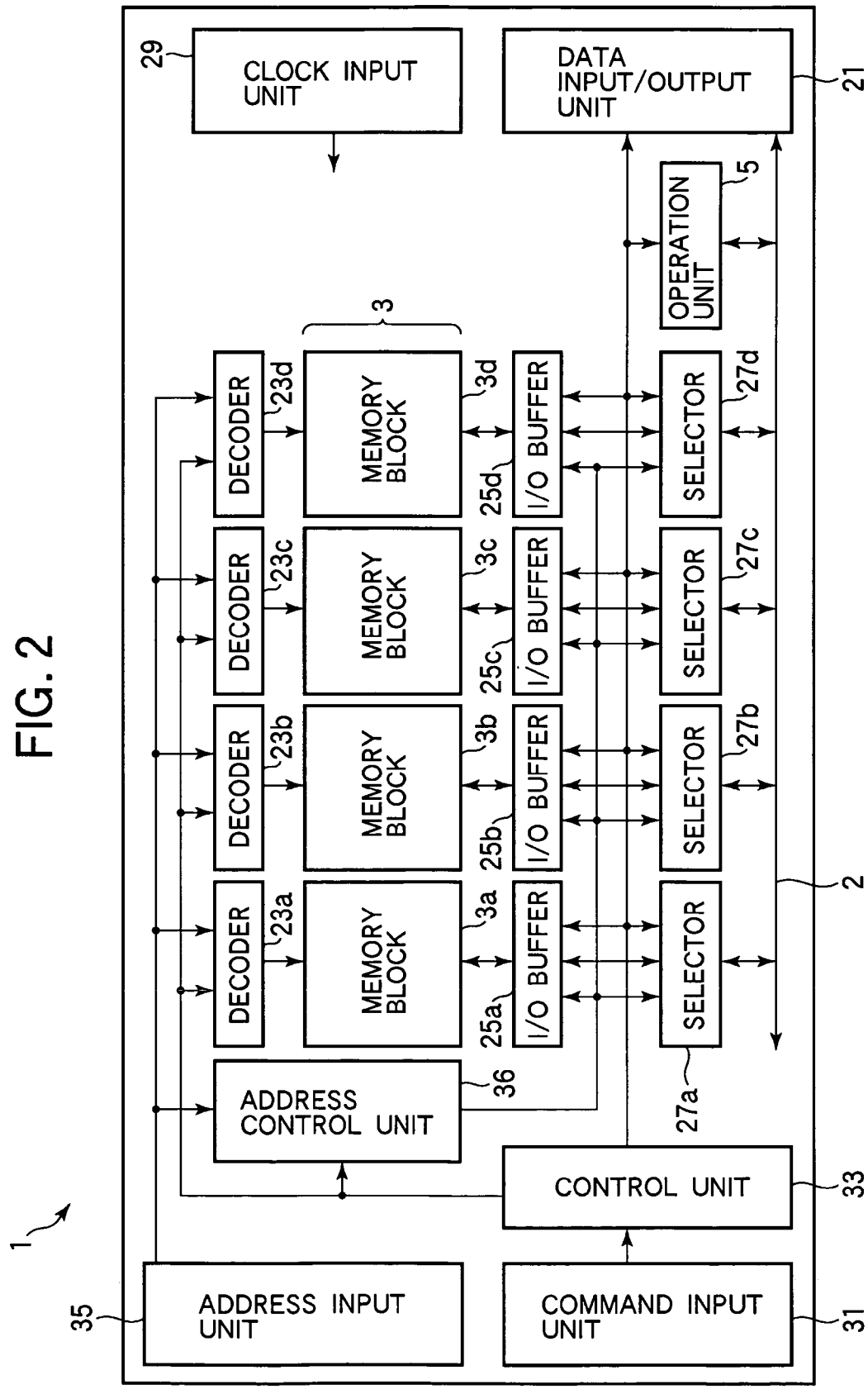
FIG. 2 is a diagram illustrating the schematic configuration of the semiconductor memory device 1 of an embodiment according to the invention.

Next, the semiconductor memory device of the embodiment will be described in more detail with reference to FIGS. 2 to 29. First, the schematic configuration of the semiconductor memory device 1 will be described with reference to FIGS. 2 to 4B. FIG. 2 is a functional block diagram illustrating the schematic configuration of the semiconductor memory device 1. As shown in FIG. 2, the semiconductor memory device 1 has the memory unit 3 in which input data is written and from which stored data is read out. The memory unit 3 is configured of multiple logic memory blocks 3*a*, 3*b*, 3*c* and 3*d* (four blocks in FIG. 2).

Furthermore, the semiconductor memory device 1 has a data input/output unit 21, a clock input unit 29, a command input unit 31, a control unit 33, an address input unit 35, and an address control unit 36.

To the clock input unit 29, for example, external clock signal CLK and clock enable signal CKE (both not shown) are supplied from the outside. The clock input unit 29 generates internal clock signal CLK1, for example, in synchronization with the rising edge of the external clock signal CLK, and generates internal clock signal CLK2 in synchronization with the falling edge of the external clock signal CLK, the internal clock signal CLK2 having a phase shifted by an angle of 180° to the internal clock signal CLK1.

For example, when the clock enable signal CKE is at the activating level, the internal clock signals CLK1 and CLK2 are supplied to the memory unit 3. In addition, the internal clock signals CLK1 and CLK2 and the clock enable signal CKE are supplied from the clock input unit 29 to the command input unit 31, the control unit 33, the address input unit 35, the address control unit 36, and the data input/output unit 21, respectively.

To the command input unit 31, various control signals (for example, generally, chip select signal/CS, low address strobe signal/RAS, column address strobe signal/CAS, write enable signal/WE, etc.) are inputted from the outside. Here, '/' represents that the signal becomes active at low (L) level.

The control unit 33 detects various commands that control the operation of the semiconductor memory device 1 from the combination of these control signals, and generates a predetermined control signal based on the relevant command. The generated control signal is inputted to selectors 27*a* to 27*d* and I/O buffers 25*a* to 25*d*, the operation unit 5, the address control unit 36, decoders 23*a* to 23*d*, etc.

Moreover, for example, the control unit 33 can set the output order when a plurality of items of operation result data are continuously outputted, and set a latency that delays and outputs data by a predetermined number of clock (for example, one, two, or three clocks) from a point of time when a read command is accepted.

The address input unit 35 outputs inputted address signals A0 to An−1 (n=4 in the embodiment) to the decoders 23*a* to 23*d* and the address control unit 36 while temporarily storing them. In the example in FIG. 2, two higher-order bits A0 and A1 of the inputted address are used as the block select address of the logic memory blocks 3*a*, to 3*d*.

The logic memory blocks 3*a*, to 3*d*, the selectors 27*a* to 27*d*, and the I/O buffers 25*a* to 25*d* are controlled their activation/inactivation by a predetermined control signal outputted from the control unit 33 and the address control unit 36.

To the data input/output unit 21, input/output data DQ0 to DQn−1 (n=4 in the embodiment) are inputted. The data input/output unit 21 has a two-way bus line 2 of n-bit parallel for write and read through which write/read data between the operation unit 5 or between the selectors 27*a* to 27*d* and I/O buffers 25*a* to 25*d* is inputted or outputted, data is written in to the logic memory blocks 3*a*, to 3*d*, and reads data is read out from the logic memory blocks 3*a*, to 3*d*. The two-way bus line 2 is connected to the selectors 27*a* to 27*d* and the I/O buffers 25*a* to 25*d* of each of the logic memory blocks 3*a* to 3*d*.

The logic memory blocks 3*a*, 3*b*, 3*c* and 3*d* each have the same function. However, supposing that the logic memory block 3*a* is a first memory block for storing input data and the logic memory blocks 3*b*, 3*c* and 3*d* are second memory blocks for reading data, for example, the data inputted to the data input/output unit 21 from the outside is stored in the first memory block 3*a* after the address inputted to the address input unit 35 is decoded by the decoder 23*a*.

Furthermore, for predetermined read data in the second memory blocks 3*b* to 3*d*, the address inputted to the address input unit 35 is decoded by the decoders 23*b*, 23*c* and 23*d* for decision. For example, when the second memory block 3*b*, the I/O buffer 25*b* and the selector 27*b* are activated, the data stored in a predetermined memory cell group in the second memory block 3b is inputted as read data to the operation unit 5 through the I/O buffer 25b, the selector 27b and the two-way bus line 2.

The control unit 33 and the address control unit 36 properly control the first memory block 3a, the second memory blocks 3b to 3d, the I/O buffers 25a to 25d, and the selectors 27a to 27d so as to transmit the input data, the read data and the operation result data at predetermined timings. The control unit 33, the address control unit 36, etc. are operated in synchronization with the clock signal inputted to the clock input unit 29.

The operation unit 5 processes a predetermined operation between the read data and the input data, and outputs the operation result data to the data input/output unit 21 through the two-way bus line 2. Although it will be described in detail later, the operation unit 5 can operate the input data with the read data each read out from the second memory blocks 3b, 3c and 3d, and continuously output the operation result data to the data input/output unit 21 in a predetermined order. Furthermore, the operation unit 5 has a plurality of types of operation functions such as OR, AND, and exclusive OR, and can select one of the plurality of types of operation based on an operation specify signal outputted from an operation specifying unit (not shown) equipped in the control unit 33, for example. Moreover, the operation unit 5 can select a non-operation state in which read data is output without operation with input data.

Figure 3:
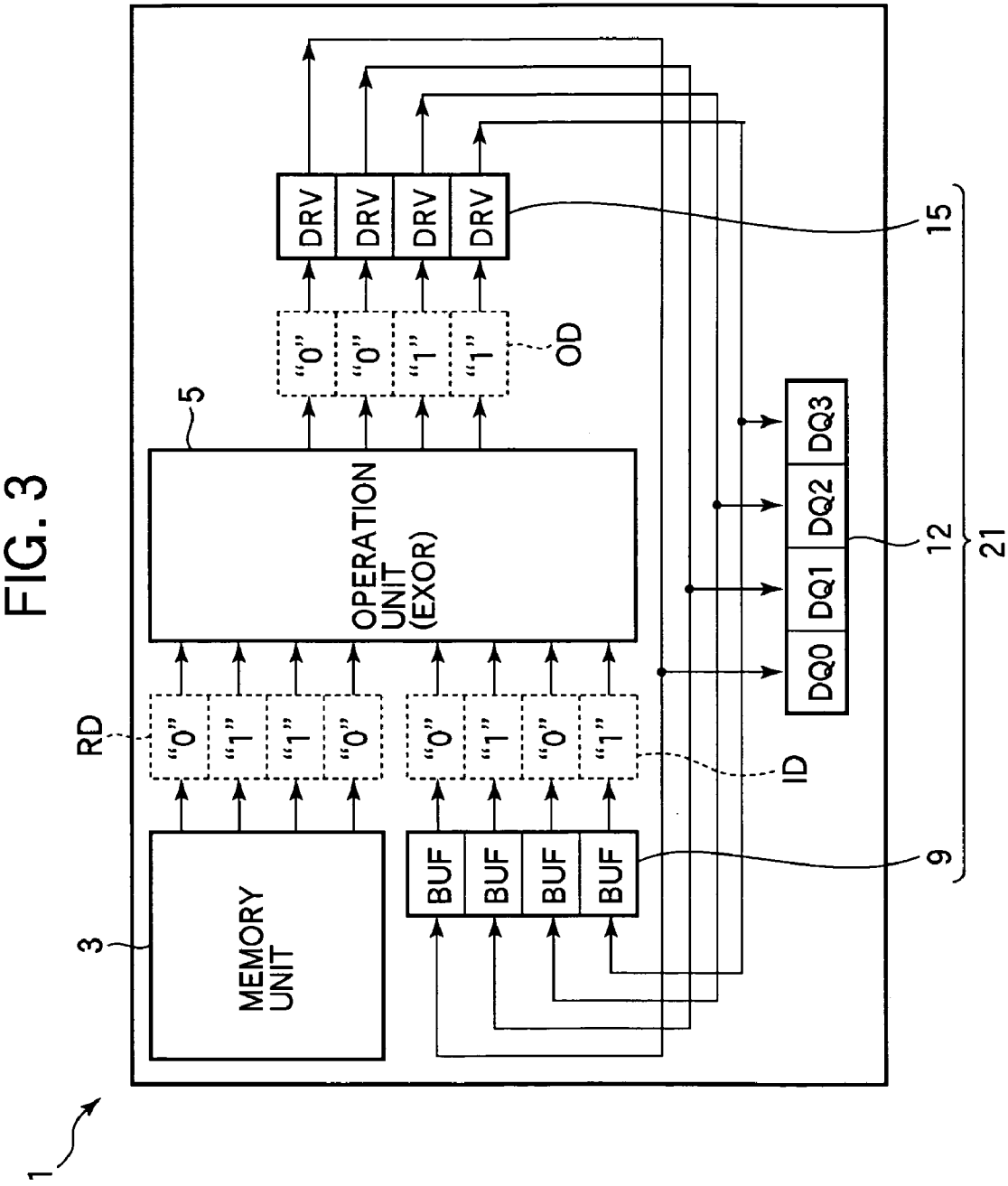
FIG. 3 is a diagram illustrating the schematic configuration of a data input/output unit 21 of the semiconductor memory device 1 of an embodiment according to the invention.

FIG. 3 depicts the schematic configuration of the data input/output unit 21. As shown in FIG. 3, the data input/output unit 21, for example, has a data input/output terminal 12 which is formed to share the functions of data input terminals to which input data is inputted from the outside and data output terminals from which operation result data of the operation unit 5 is outputted to the outside, an input data buffer 9, and a data output driver 15. The data input/output terminal 12 is configured of, for example, four terminals DQ0 to DQ3 so as to allow input of four-bit input data ID and output of four-bit operation result data OD.

Figure 4A:
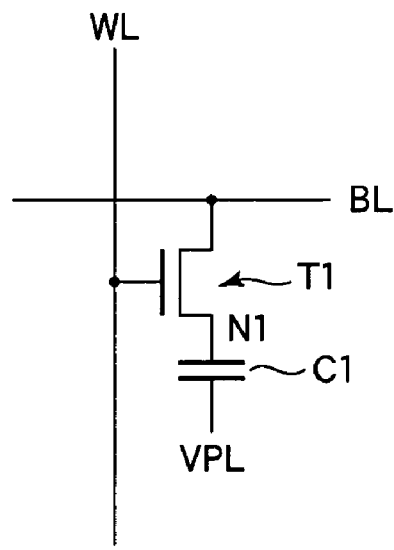
FIGS. 4A and 4B are diagrams illustrating an exemplary configuration of a memory cell in a memory unit 3 of the semiconductor memory device 1 of an embodiment according to the invention.
Figure 4B:
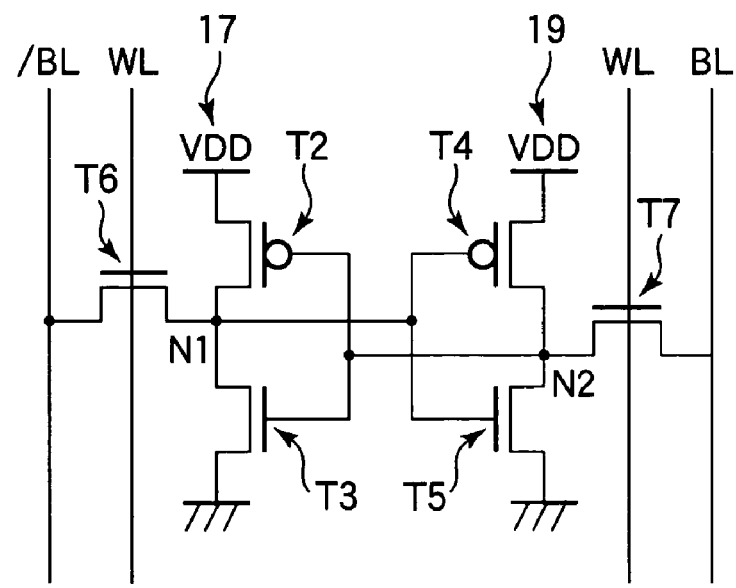

FIGS. 4A and 4B depict the circuit configuration of a memory cell among a plurality of memory cells arranged in the memory unit 3 in a matrix, for example. FIG. 4A depicts a memory cell of dynamic random access memory (DRAM), and FIG. 4B depicts a memory cell of static random access memory (SRAM). As shown in FIG. 4A, the memory cell of DRAM has an access transistor T1 a gate terminal of which is connected to a word line WL, and a capacitance C1 one electrode of which is connected to a bit line/BL through the access transistor T1 and the other electrode of which is connected to a predetermined voltage output terminal. To the other electrode of the capacitance C1, voltage VPL outputted from the voltage output terminal is applied. In the memory cell, one electrode of the capacitance C1 is storage node N1. In the memory cell of DRAM, data of "1" or "0" is stored in the capacitance C1. Through the access transistor T1, read data and write data are transferred between the capacitance C1 and the bit line/BL.

As shown in FIG. 4B, the memory cell of SRAM has complementary metal oxide semiconductor (CMOS) inverters 17 and 19. The CMOS inverter 17 is configured by connecting P-type MOS transistor T2, a load element, and N-type MOS transistor T3 in series between power supply VDD and reference potential (ground). The CMOS inverter 19 is configured by connecting P-type MOS transistor T4, a load element, and N-type MOS transistor T5 in series between power supply VDD and ground. Each output of the CMOS inverters 17 and 19, that is, each potential of storage nodes N1 and N2 is the other's input of the CMOS inverters 19 and 17, more specifically, each gate input of the N-type MOS transistors T3 and T5. The storage node N1 of the CMOS inverter 17 is connected to the bit line/BL through an access transistor T6 the gate terminal of which is connected to the word line WL. The storage node N2 of the CMOS inverter 19 is connected to the bit line/BL through an access transistor T7 the gate terminal of which is connected to the word line WL. Here, "/" represents that the signal level becomes active at low level (0). In the memory cell of SRAM, data "1" or "0" is stored in a pair of the CMOS inverters 17 and 19. Through the access transistors T6 and T7, read data and write data are transferred between the pair of the CMOS inverters 17 and 19 and the bit lines/BL and BL. The structure of the memory cell in the memory unit 3 may be any memory cell of DRAM or SRAM.

Figure 5:
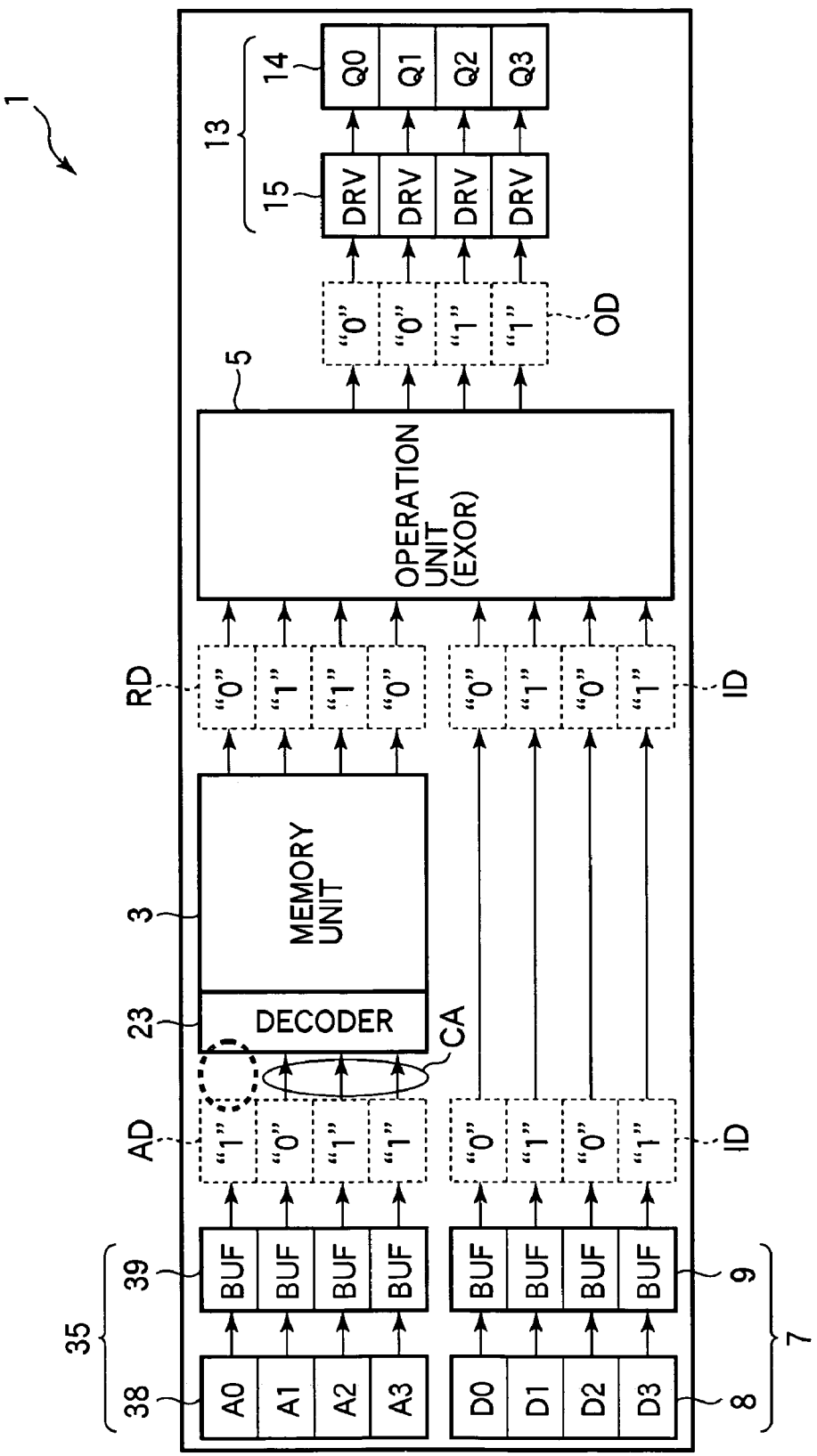
FIG. 5 is a diagram illustrative of a selection method of data to be read in the semiconductor memory device 1 of an embodiment according to the invention.
Figure 6:
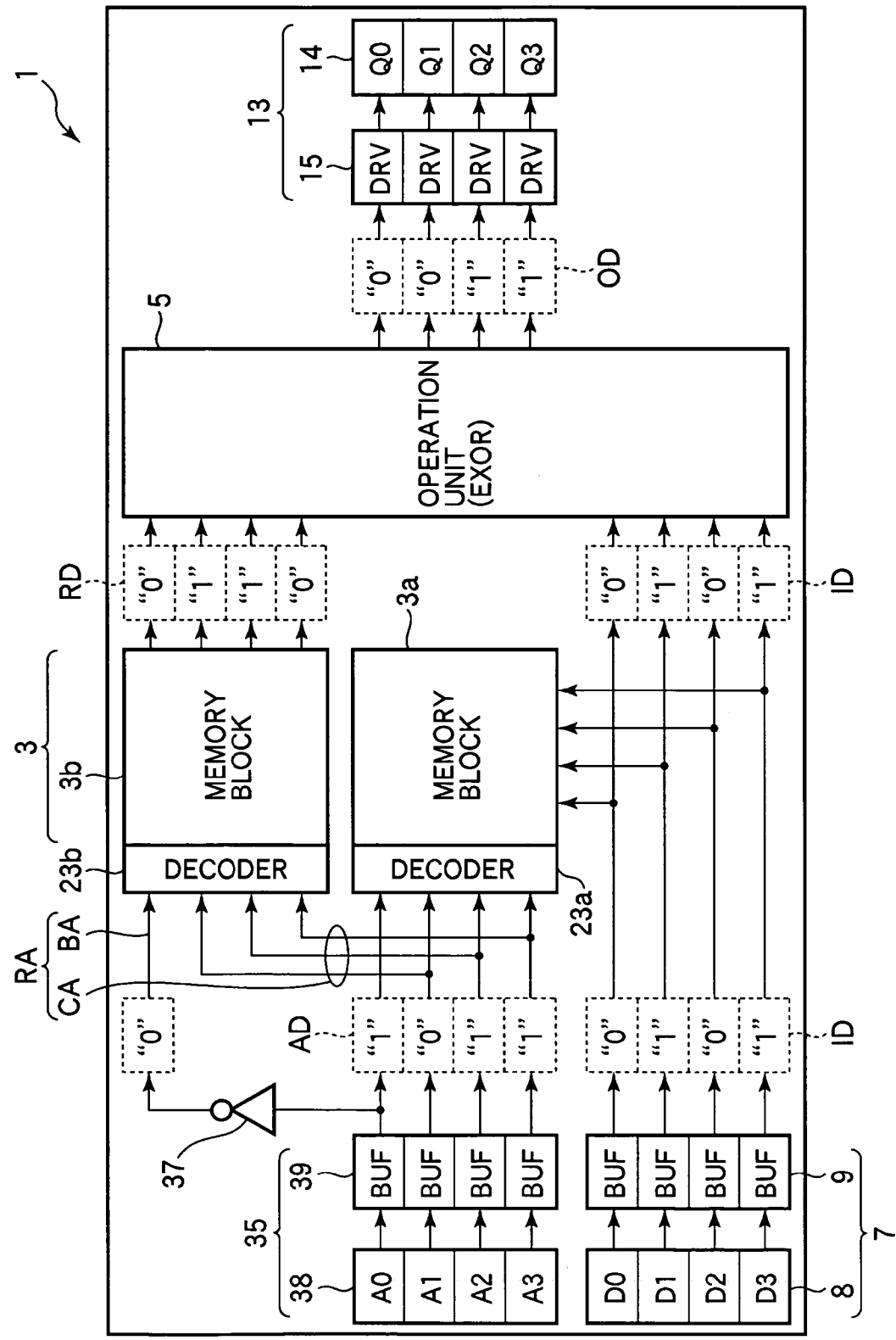
FIG. 6 is a diagram illustrating the configuration of storing input data and reading predetermined data out of the memory unit 3 of the semiconductor memory device 1 of an embodiment according to the invention.

Next, each component unit and its modification of the semiconductor memory device 1 shown in FIG. 2 and a control method of the semiconductor memory device 1 will be described with reference to FIGS. 5 to 29. FIG. 5 is a diagram illustrative of a selection method of predetermined read data. For convenience of explanation, FIG. 5 only depicts a part or the essential part of the semiconductor memory device 1 shown in FIG. 2. In FIG. 6 onward, only a part or the essential part of the semiconductor memory device 1 shown in FIG. 2 is depicted for explanation, as needed. In addition, instead of the data input/output unit 21 exemplified in FIG. 3, the data input unit 7 and the data output unit 13 exemplified in FIG. 1 will be used and described, as needed. As shown in FIG. 5, the address input unit 35 has an address input terminal 38 to which a predetermined address is inputted, and an input address buffer 39 in which the predetermined address is temporarily stored. The address input terminal 38 is configured of four terminals A0 to A3, for example, so that a four-bit address is inputted. For example, data of the most significant bit is inputted to the terminal A0, and for example, data of the least significant bit is inputted to the terminal A3.

Read address RA that selects a memory cell group where the read data RD is stored from a plurality of memory cells (not shown) in the memory unit 3 is matched with a part of a plurality of bits of input data related address AD inputted to the address input unit 35 in association with the input data ID, and the other part is not matched with the other part of the input data related address AD. In the example shown in FIG. 5, ignoring a bit (for example, the most significant bit expressed by an ellipse of a broken line) not matched with the input data related address AD, cell select address CA formed of bits (011) matched with the input data related address AD is decoded by the decoder 23, and the memory cell group where the read data RD is stored is decided.

FIG. 6 depicts the configuration in which the input data ID is stored in the memory unit 3 and predetermined read data RD is read out. In the configuration shown in FIG. 6, the most significant bit of the input data related address AD is block select address BA for selecting the first or the second memory block.

In the address control unit 36 in FIG. 2, an address specifying unit 37 is disposed which has an inverter circuit to invert the value of the most-significant bit of the input data related address AD. When the input data related address AD is inputted from the address input unit 35 to the address control unit 36, the address specifying unit 37 generates a block select address BA that is created by inverting the value of the most significant bit of the input data related address AD, and combines with the cell select address CA having the same values as the lower-order three bits of the input data related address AD to create a read address RA.

The input data related address AD is transmitted from the address control unit 36 to the decoder 23a to be decoded, and the input data ID is stored in the first memory block 3a for input data storage. The read address RA is transmitted from the address control unit 36 to the decoder 23b to be decoded, and predetermined read data RD is read out from the second memory block 3b for data read. In this manner, input data is stored in the first memory block 3a, and read data is read out of the second memory block 3b, and transmitted to the operation unit 5.

Since the input data related address AD and the read address RA can be transmitted from the address control unit 36 nearly at the same time, storage of the input data ID and read of the read data RD can be done nearly simultaneously. More specifically, the semiconductor memory device 1 according to the embodiment can specify a memory block (first memory block 3a) for input data write and a memory block for data read (second memory block 3b) nearly simultaneously with respect to a single input data related address AD, and thus high-speed data processing is feasible.

Figure 7:
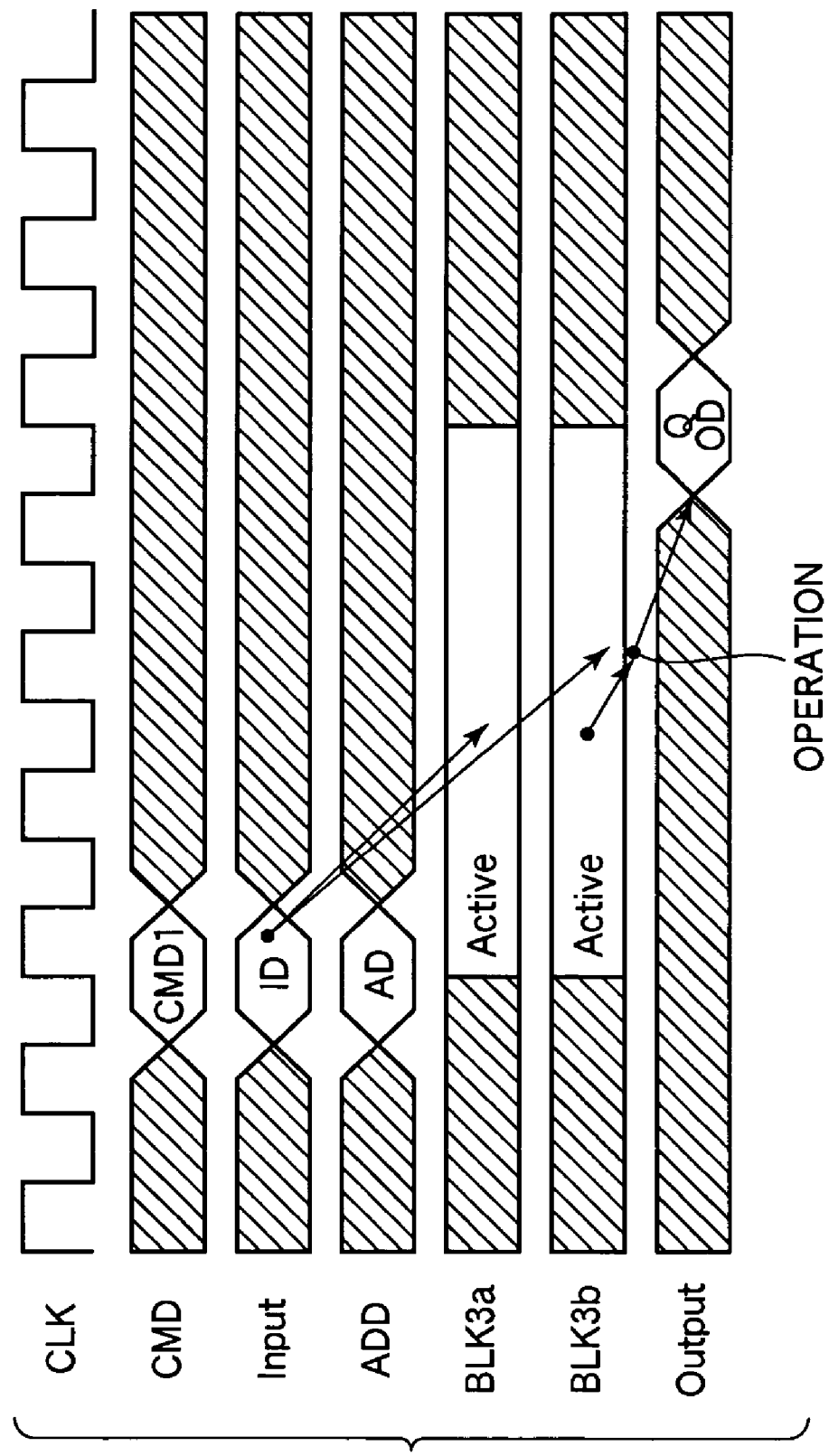
FIG. 7 is a diagram illustrating an exemplary operation timing for input, output and operation in the semiconductor memory device 1 of an embodiment according to the invention.

Next, the data processing operation in the semiconductor memory device 1 will be described with reference to FIG. 7. FIG. 7 is a timing chart illustrating the operation of input, output and operation in the semiconductor memory device 1 in FIG. 6. In FIG. 7, from the upper row shown are the clock signal CLK from the clock input unit 29, the command (CMD) detected at the control unit 33 based on various control signals inputted to the command input unit 31, the input data (Input) inputted to the data input unit 7, a predetermined address (ADD) inputted to the address input unit 35, the first memory block 3a (BLK3a), the second memory block 3b (BLK3b), and the output data (Output) outputted from the data output unit 13 to the outside. Furthermore, time passage is expressed from the left to the right in FIG. 7.

As shown in FIG. 7, memory block activating command CMD1 that activates each of the memory blocks 3a and 3b, and the input data ID and the input data related address AD that are associated with the memory block activating command CMD1 are latched at the rising edge of the clock signal CLK, and inputted into the semiconductor memory device 1. The memory block activating command CMD1 and the input data related address AD activate each of the memory blocks 3a and 3b, for example, at the same time. The input data ID is written to the first memory block 3a based on the input data related address AD. The read data RD is read out from the second memory block 3b based on the read address RA. The operation unit 5 operates the input data ID and the readout data RD to output the operation result data OD to the data output unit 13. The semiconductor memory device 1 outputs the read data OD as the output data Q from the data output unit 13 to the outside.

Figure 8:
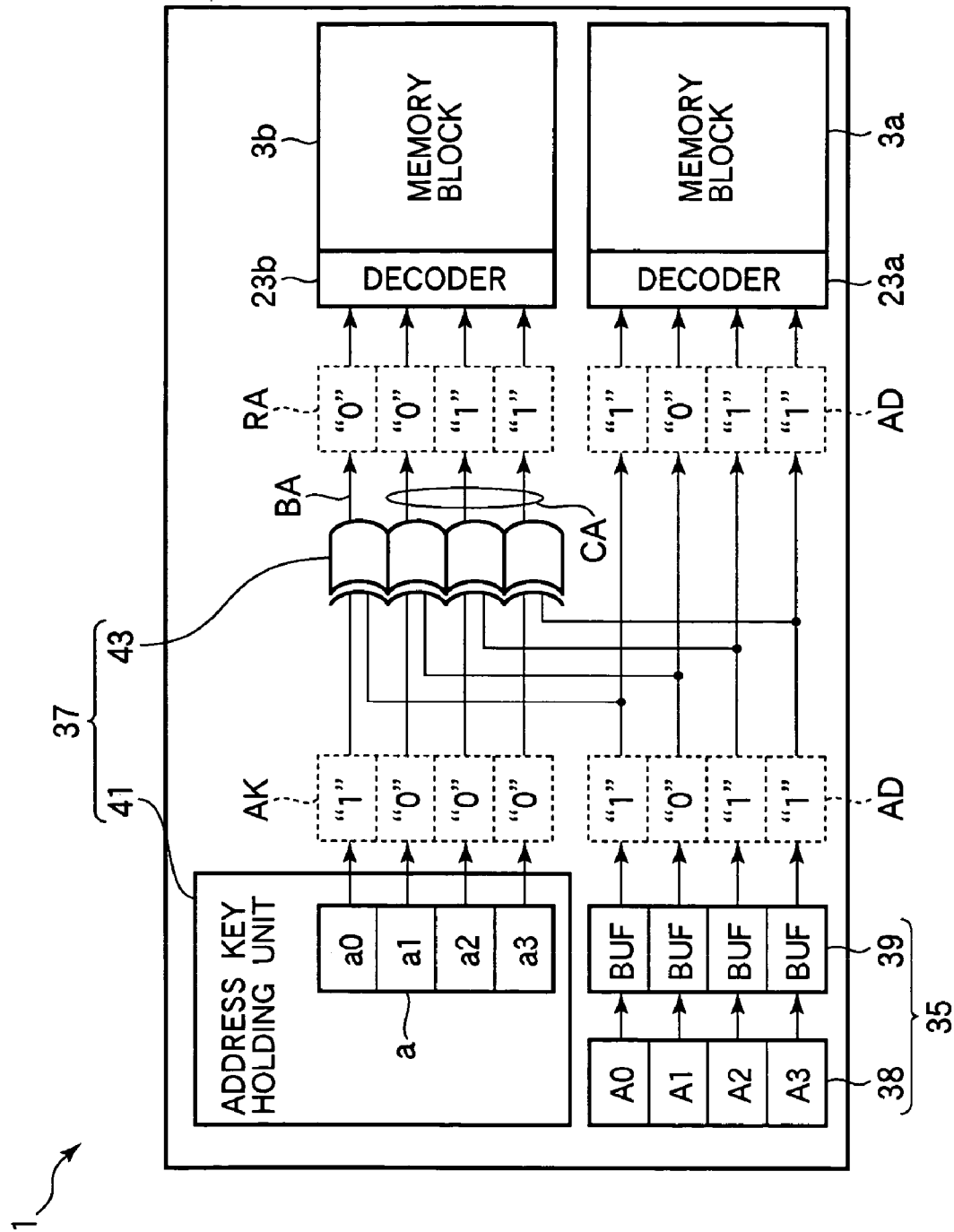
FIG. 8 is a diagram illustrating a modification of an address specifying unit 37 equipped in the semiconductor memory device 1 of an embodiment according to the invention.

FIG. 8 depicts a modification of the address specifying unit 37. An address specifying unit 37 of the modification has an address key holding unit 41 which holds address key AK, and an address operation unit 43 which operates the address key AK and the input data related address AD. The address key holding unit 41 has an address key storing unit a, which stores a four-bit address key AK, for example. Although the bit number of the address key AK is not limited to four, it is preferably the same bit number as that of the input data related address AD. The address operation unit 43 processes a predetermined operation for the address key AK and the input data related address AD, and outputs the read address RA that is created by combining the cell select address CA with the block select address BA. For example, the address operation unit 43 of the modification has the configuration in which four EXOR gate circuits each having input of each bit data of the address key AK and the input data related address AD are combined.

For example, in order to use the most significant bit of the input data related address AD as the block select address BA, the address key AK (for example, '1000') is stored in the address key storing parts a0 to a3. Thus, the address key AK (1000) and the input data related address AD (for example, '1011') are operated (EXORed) at the address operation unit 43 to obtain the read address RA (0011). As described above, the most significant bit of the address is used as the block select address BA, the input data related address AD is transmitted to the decoder 23a to be decoded, and the input data ID is stored in the first memory block 3a for data storage. The read address RA is transmitted to the decoder 23b to be decoded, and predetermined read out data RD is read out from the second memory block 3b for data read.

Figure 9:
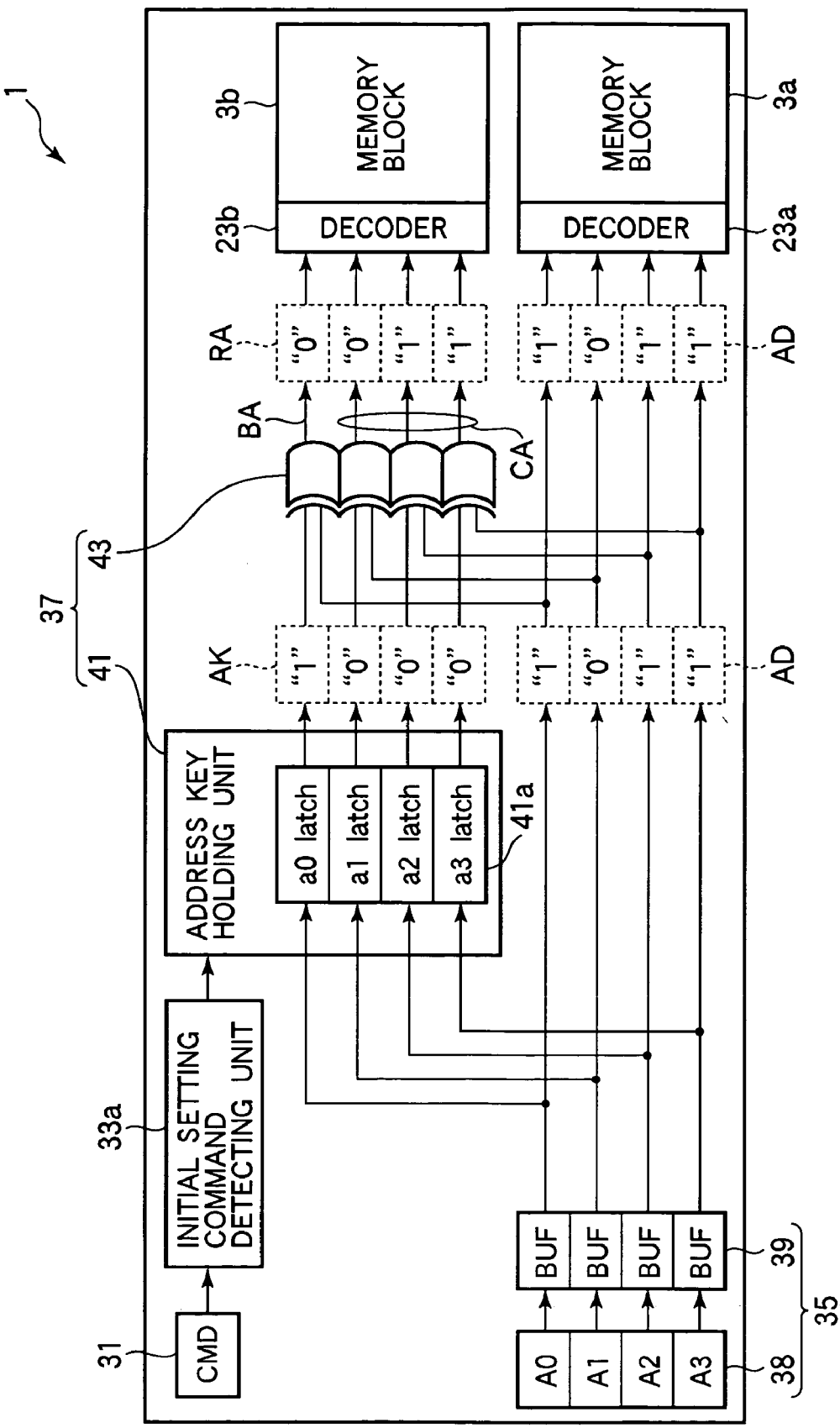
FIG. 9 is a diagram illustrating another modification of the address specifying unit 37 equipped in the semiconductor memory device 1 of an embodiment according to the invention.

FIG. 9 depicts another modification of the address specifying unit 37. An address specifying unit 37 of the modification is characterized in that it has an address key holding unit 41 which can hold the address key AK inputted to the address input unit 35 in association with an initial setting command that initially sets various operation modes of the semiconductor memory device 1. Furthermore, the address specifying unit 37 has an address operation unit 43 having the same configuration as shown in FIG. 8. The address key holding unit 41 has an address key latch unit 41a which latches the address key AK. The address key holding unit 41 is controlled by an initial setting command detecting unit 33a to hold the address key AK in the address key latch unit 41a. For example, the initial setting command detecting unit 33a is disposed in the control unit 33 shown in FIG. 2.

For example, the semiconductor memory device 1 can input a command (address key specifying command) that specifies the address key AK for one of initial setting commands. When the initial setting command detecting unit 33a detects the address key specifying command from the combination of the logic levels of a plurality of the control signals inputted to the command input unit 31 at the time of initial setting, it controls the address key holding unit 41 so as to latch and hold the address key AK inputted to the address input unit 35 nearly simultaneously as those control signals. Therefore, the address key AK is held in the address key holding unit 41, and the address specifying unit 37 can specify the read address RA that is a combination of the block select address BA and the cell select address CA by the same operation as that of the address specifying unit 37 shown in FIG. 8.

Figure 10:
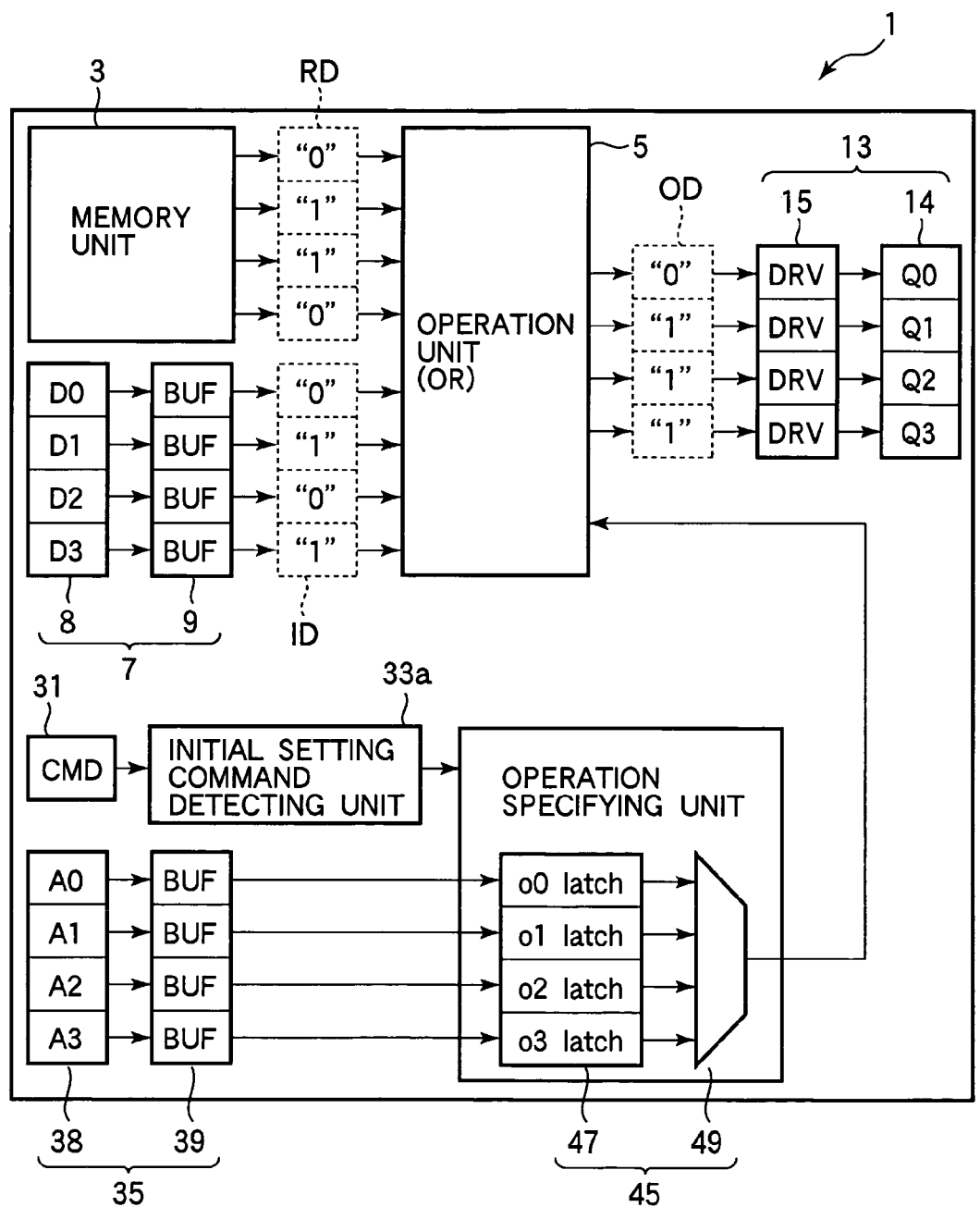
FIG. 10 is a diagram illustrating an operation specifying unit 45 equipped in the semiconductor memory device 1 of an embodiment according to the invention.
Figure 11:
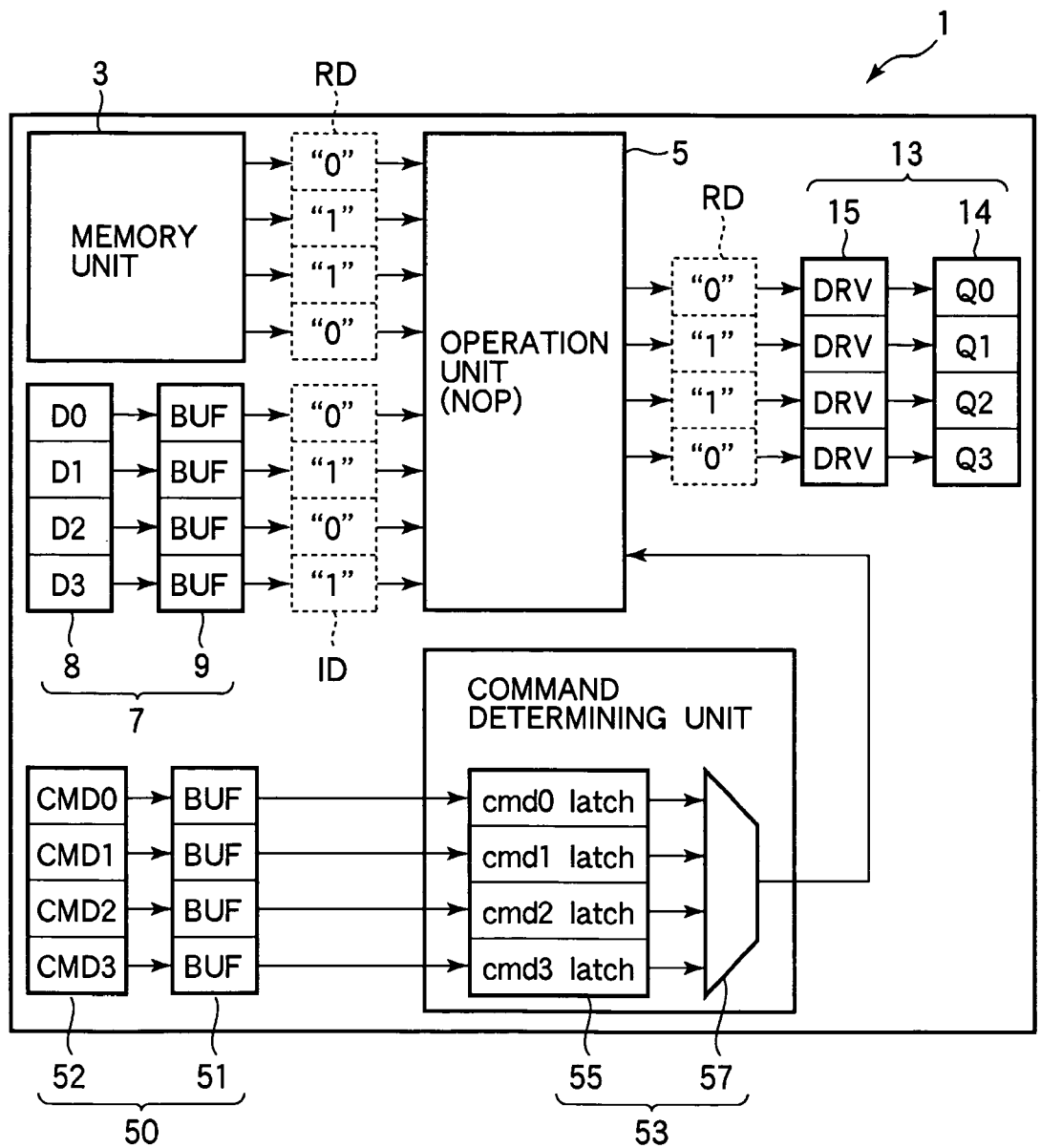
FIG. 11 is a diagram illustrating a command determining unit 53 equipped in the semiconductor memory device 1 of an embodiment according to the invention.

Next, the operation unit 5 will be described with reference to FIGS. 10 and 11. The operation unit 5 has a plurality of types of operation functions, and can select one among the plurality of types of operation. Furthermore, the operation unit 5 can select a non-operation state in which read data RD is outputted without operating the input data ID and the read data RD.

First, a selection method of a plurality of types of operation will be described with reference to FIG. 10. FIG. 10 depicts an operation specifying unit 45 which specifies an operation type in the operation unit 5. The operation specifying unit 45 has an operation select address holding unit 47 which latches and holds an operation select address inputted to the address input unit 35, and an operation specify signal creating unit 49 which generates an operation specifying signal that specifies one operation from the operation select address and outputs it to the operation unit 5. The operation select address holding unit 47 is configured of multiple latch parts o0 to o3 (four parts in FIG. 10) so that at least a part of a predetermined address inputted to the address input unit 35 is inputted. The operation select address is inputted to the address input unit 35 in association with the initial setting command that initially sets various operation modes of the semiconductor memory device 1.

For example, the semiconductor memory device 1 can input a command (operation type specifying command) that specifies an operation type to one of the initial setting commands. When the initial setting command detecting unit 33a detects the operation type specifying command from the combination of the logic levels of a plurality of the control signals inputted to the command input unit 31 at the time of initial setting, it controls the operation select address holding unit 47 so as to latch and hold the operation select address inputted to the address input unit 35 nearly simultaneously as the control signal. Thus, the operation select address is held in the operation select address holding unit 47. The operation specifying unit 45 outputs an operation specifying signal that specifies one operation from the operation specify signal creating unit 49 based on the held operation select address. As shown in FIG. 10, for example, the operation unit 5 specifies a logical OR (OR) as an operation type by the operation specifying signal outputted from the operation specifying unit 45, ORs the input data ID (for example, '0101') and the read data RD (for example, '0110'), and outputs the operation result data OD (0111).

Since the semiconductor memory device 1 separately has the operation unit 5 independent of the memory unit 3, it can relatively freely secure the arrangement area for the operation unit 5 on a semiconductor circuit board. Therefore, the flexibility of layout design of the semiconductor memory device 1 is improved. Thus, in addition to logical operations such as EXOR and OR, complicated operation functions such as addition that increases circuit scale can be easily provided as needed.

Next, selection of the non-operation state in the operation unit 5 will be described with reference to FIG. 11. FIG. 11 depicts a command determining unit 53 which determines operation or non-operation at the operation unit 5. The command determining unit 53 determines operation or non-operation based on an operation determination command inputted from the outside. The command determining unit 53 has an operation command signal holding unit 55 which latches and holds multiple operation command signals (four signals in FIG. 11) inputted to an operation determine command input unit 50, and an operation determination signal creating unit 57 which generates an operation determination signal that determines operation or non-operation from the operation command signal and outputs it to the operation unit 5. The operation determine command input unit 50 is disposed in the command input unit 31 shown in FIG. 2, for example. The operation determine command input unit 50 has an operation command signal input terminal 52, and an operation command signal buffer 51 which temporarily stores the operation command signal.

The operation command signal input terminal 52 is configured of multiple latch parts cmd0 to cmd3 (four parts in FIG. 11) so as to hold a plurality of operation command signals. When the command determining unit 53 detects a non-operation (NOP) from the combination of the logic levels of the operation command signals that are inputted to the terminals CMD0 to CMD3 of the operation command signal input terminal 52 and temporarily stored in the buffer 51, it outputs the operation determination signal that specifies non-operation to the operation unit 5. As shown in FIG. 11, for example, the operation unit 5 specifies non-operation based on the operation determination signal outputted from the command determining unit 53, does not process logical operation for the input data ID (for example, '0101') and the read data RD (for example, '0110'), and outputs the read data RD (0110) as it is.

Since the operation command signal is inputted at every clock cycle, for example, the operation unit 5 can select the operation state or the non-operation state at every clock cycle. Furthermore, since a plurality of operation types are set to the combinations of the logic levels of operation command signals, the operation unit 5 can change the operation type at every clock cycle, or can select the non-operation state. In the example shown in FIG. 11, since the four-bit operation command signal can be inputted, 15 types of operations can be set in addition to the non-operation state.

Figure 12:
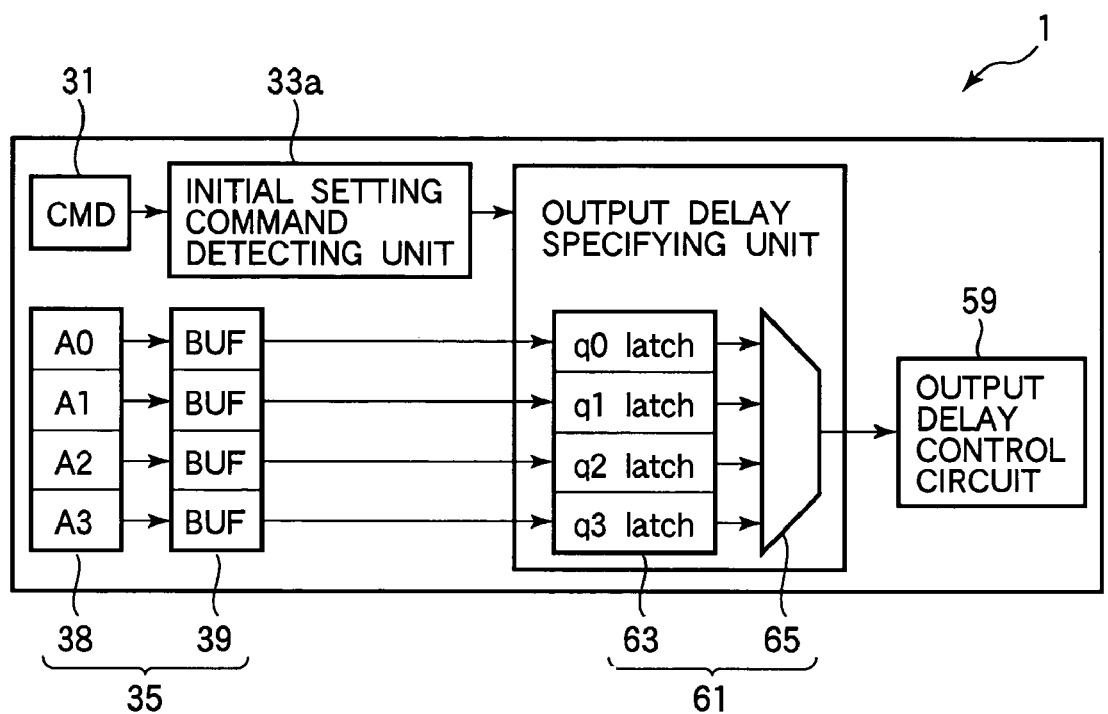
FIG. 12 is a diagram illustrating an output delay control unit equipped in the semiconductor memory device 1 of an embodiment according to the invention.
Figure 13:
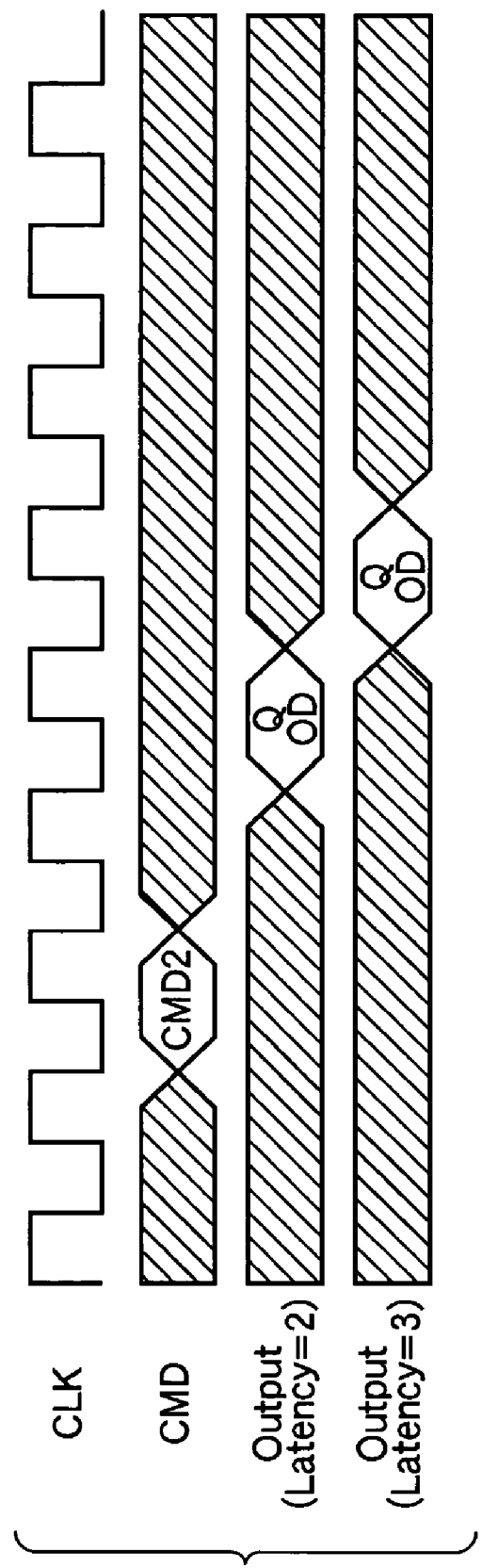
FIG. 13 is a diagram illustrating an exemplary output timing for operation result data OD of the semiconductor memory device 1 of an embodiment according to the invention.

Next, the output timing of the operation result data OD from the data input/output unit 21 (the data output unit 13) will be described with reference to FIGS. 12 and 13. FIG. 12 depicts the configuration of an output delay control unit which controls the output timing of the operation result data OD. FIG. 13 depicts exemplary output timing of the operation result data OD.

As shown in FIG. 12, the output delay control unit has an output delay specifying unit 61 which holds the output control address inputted to the address input unit 35 in association with the initial setting command that initially sets various operation modes of the semiconductor memory device 1 to specify an output delay, and an output delay control circuit 59 which controls the output timing of the operation result data OD based on an output delay signal from the output delay specifying unit 61. The output delay specifying unit 61 has an output control address holding unit 63 which latches and holds the output control address, and an output delay signal creating unit 65 which generates the output delay signal that specifies an output delay from the output control address and outputs it to the output delay control circuit 59. The output control address holding unit 63 is configured of multiple latch parts q0 to q3 so as to latch a plurality of bits of output control address (four bits in FIG. 12).

For example, the semiconductor memory device 1 can input a command (output control command) that sets the output timing to one of the initial setting commands. When the initial setting command detecting unit 33a detects the output control command from the combination of the logic levels of a plurality of the control signals inputted to the command input unit 31 at the time of initial setting, it controls the output delay specifying unit 61 so as to latch and hold the output control address inputted to the address input unit 35 nearly simultaneously as the control signals. Therefore, the output control address is held in the output control address holding unit 63. The output delay specifying unit 61 outputs the output delay signal from the output delay signal creating unit 65 to the output delay control circuit 59 based on the held output control address. The output delay control circuit 59 controls the output timing of the operation result data OD based on the output delay signal. The output timing for the operation result data OD is specified as delay time or clock delay.

FIG. 13 is a timing chart of the semiconductor memory device 1 when the output timing of the operation result data OD is specified as a clock delay. In FIG. 13, from the upper row, shown are the clock signal CLK from the clock input unit 29, the command (CMD) detected at the control unit 33 based on various control signals inputted to the command input unit 31, and the output data (Output) outputted from the data output unit 13 to the outside where the clock delay is two (Latency=2) and the clock delay is three (Latency=3).

According to the combination of the logic levels of a plurality of the control signals in the output control command at the time of initial setting, the clock delay (in the embodiment, latency is two or three) is decided. As shown in FIG. 13, output control command CMD2 is latched as a predetermined command at the rising edge of the clock signal CLK, and inputted into the semiconductor memory device 1. After two clocks (Latency=2) or three clocks (Latency=3) from the input of the output control command CMD2, the semiconductor memory device 1 outputs the read data OD as the output data Q from the data output unit 13 to the outside in synchronization with the rising edge of the clock signal CLK.

Moreover, when the output timing of the operation result data OD (output data Q) is specified as the delay time, the operation result data OD is outputted from the data output unit 13 to the outside after the specified delay time has elapsed from the input of the output control command CMD2.

Figure 14:
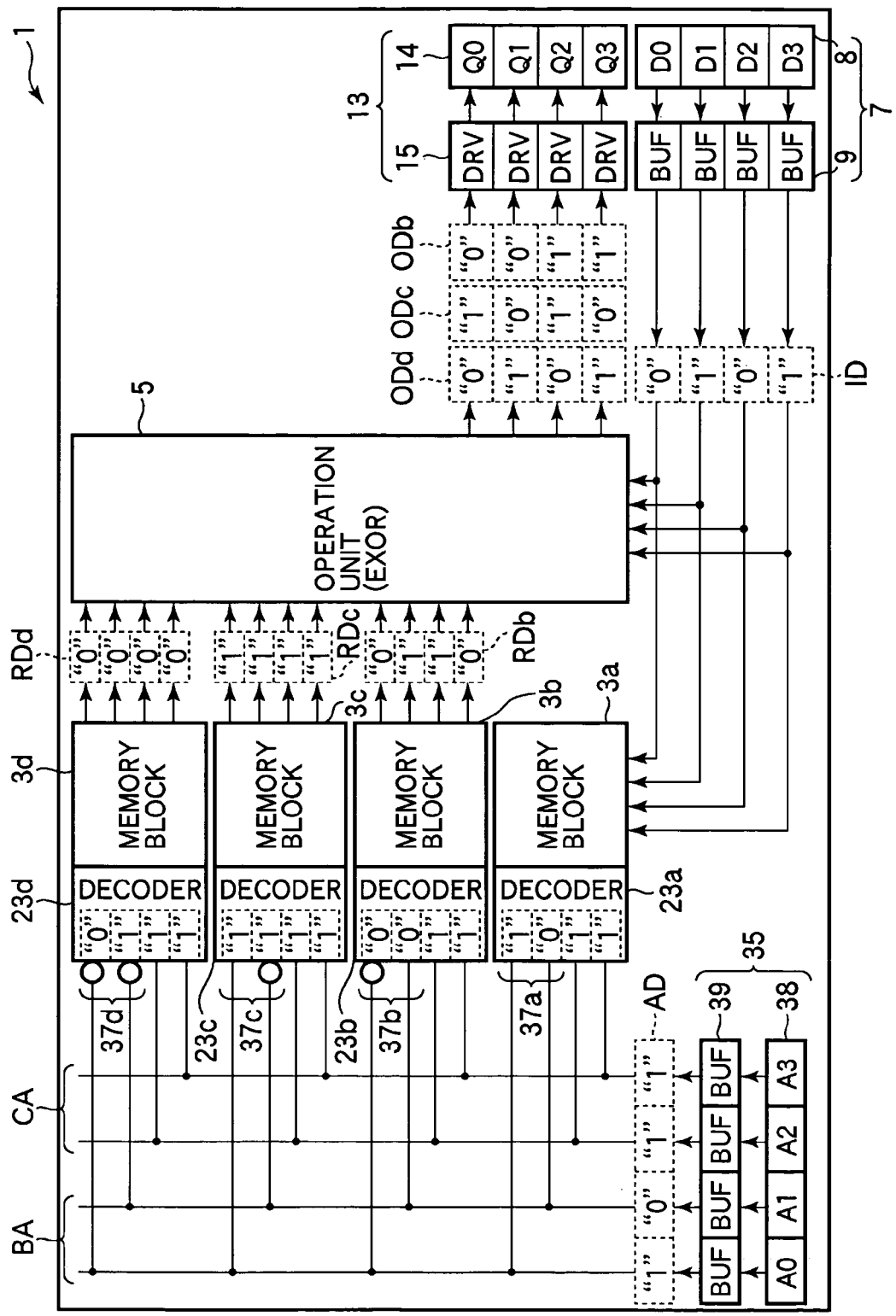
FIG. 14 is a diagram partially illustrating the schematic configuration of the semiconductor memory device 1 of an embodiment according to the invention.

Next, the operation for a plurality of items of read data read out from the memory unit 3 and input data will be described with reference to FIGS. 14 to 21. FIG. 14 partially depicts the schematic configuration of the semiconductor memory device 1. In FIG. 14, although the logic memory blocks 3a, 3b, 3c and 3d in the memory unit 3 each have the same function, for convenience of explanation, suppose that the logic memory block 3a is a first memory block for data storage, and the logic memory blocks 3b, 3c and 3d are second memory blocks for data read.

As shown in FIG. 14, the second memory blocks 3b, 3c and 3d are selected by the two-bit block select address BA. For example, two higher-order bits of the input data related address AD are specified to the block select address BA, and two lower-order bits are specified to the cell select address CA.

An address specifying unit 37a is configured so as to input the values of two higher-order bits A0 and A1 of the input data related address AD to the decoder 23a as they are. Therefore, the same value as that of the input data related address AD (for example '1011') is inputted to the decoder 23a, and the input data ID (for example, '0101') is written to the first memory block 3a.

An address specifying unit 37b is configured so as to invert the value of the most significant bit A0 of the input data related address AD, input it to the decoder 23b, and input the value of the higher-order bit A1 to the decoder 23b as it is. Supposing that the value of the input data related address AD is '1011', for example, '0011' is inputted as read address RAb to the decoder 23b, read data RDb (for example, '0110') is outputted from the second memory block 3b.

An address specifying unit 37c is configured so as to input the value of the most significant bit A0 of the input data related address AD to the decoder 23c as it is, invert the value of the higher-order bit A1, and input it to the decoder 23c. Thus, '1111' is inputted as read address RAc to the decoder 23C, and read data RDc (for example, '1111') is outputted from the second memory block 3c.

An address specifying unit 37d is configured so as to invert the values of two higher-order bits A0 and A1 of the input data related address AD and input them to the decoder 23d. Therefore, '0111' is inputted as read address RAd to the decoder 23d, and read data RDd (for example, '0000') is outputted from the second memory block 3d.

To each of the decoders 23b to 23d, each of the read addresses RDb to RDd based on the input data related address AD is inputted nearly simultaneously, and the second memory blocks 3b, 3c and 3d are selected as the data read memory blocks nearly simultaneously. The second memory blocks 3b, 3c and 3d output the read data RDb, RDc and RDd to the operation unit 5, respectively, in accordance with a predetermined order. The operation unit 5 operates (for example, EXORs) the read data RDb, RDc and RDd and the input data ID, and outputs operation result data ODb, ODc and ODd in a predetermined order. The data output unit 13 continuously outputs the operation result data ODb, ODc and ODd obtained at the operation unit 5 to the outside in that predetermined order.

Next, the operation timing of the semiconductor memory device 1 shown in FIG. 14 will be described with reference to FIGS. 15 to 18. FIGS. 15 to 18 are timing charts illustrating the data input/output operation in the semiconductor memory device 1. In FIGS. 15 to 18, from the upper row in each drawing, shown are the clock signal CLK (in FIGS. 17 and 18, two clock signals CLK1 and CLK2) from the clock input unit 29, the command (CMD) detected at the control unit 33, the output data (Output) where the clock delay is two (Latency=2) and three (Latency =3), the input data (Input) inputted to the data input unit 7, and the address (ADD) inputted to the address input unit 35.

Figure 15:
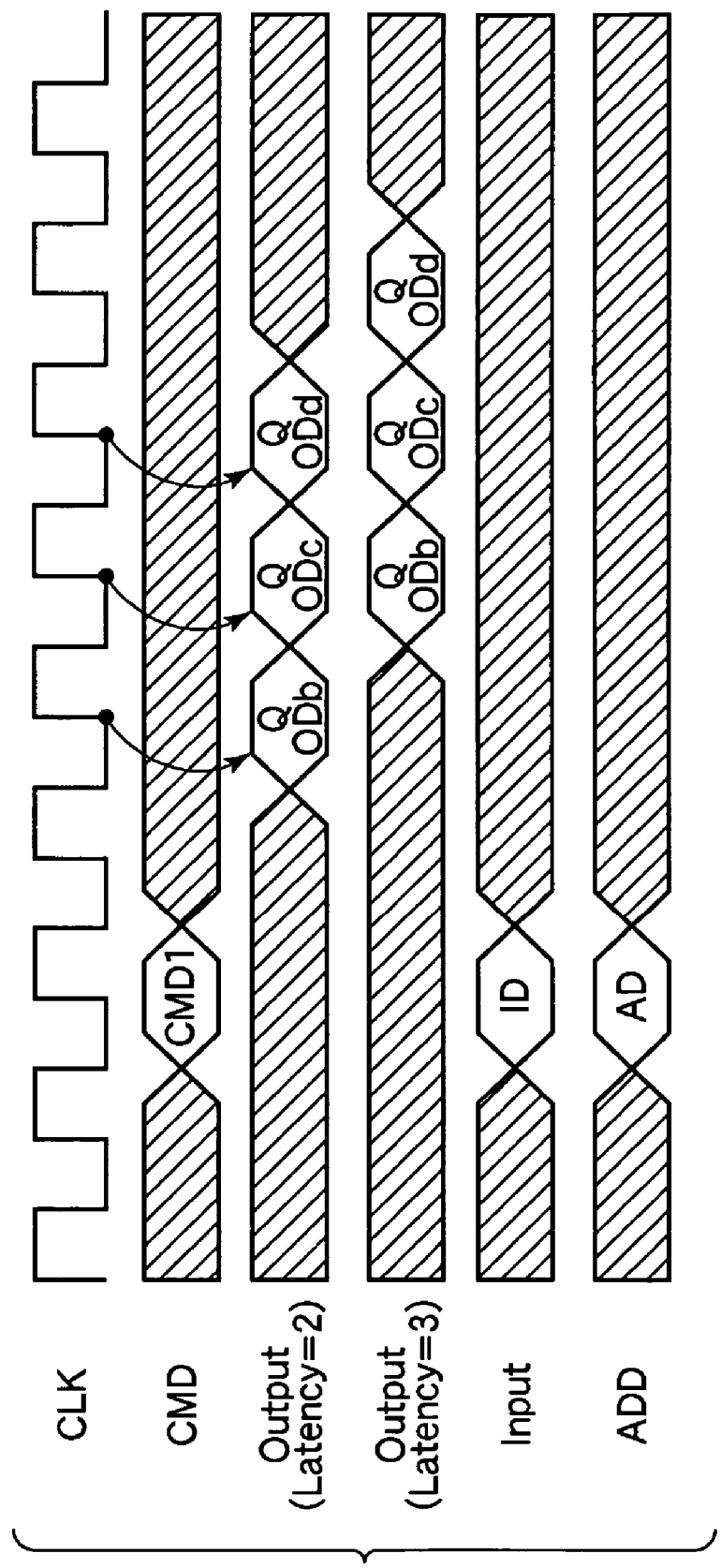
FIG. 15 is a diagram illustrating a first operation timing for the semiconductor memory device 1 of an embodiment according to the invention.

FIG. 15 depicts a first operation timing in the semiconductor memory device 1. The first operation timing is characterized in that the operation result data ODb, ODc and ODd are continuously outputted in synchronization only with either one of the rising edge or the falling edge of the clock signal CLK. FIG. 15 depicts exemplary operation timing where the operation result data ODb, ODc and ODd are outputted in synchronization with the rising edge of the clock signal CLK. In addition, the order of outputting the operation result data ODb, ODc and ODd is not limited to the order shown in FIG. 15.

Figure 16:
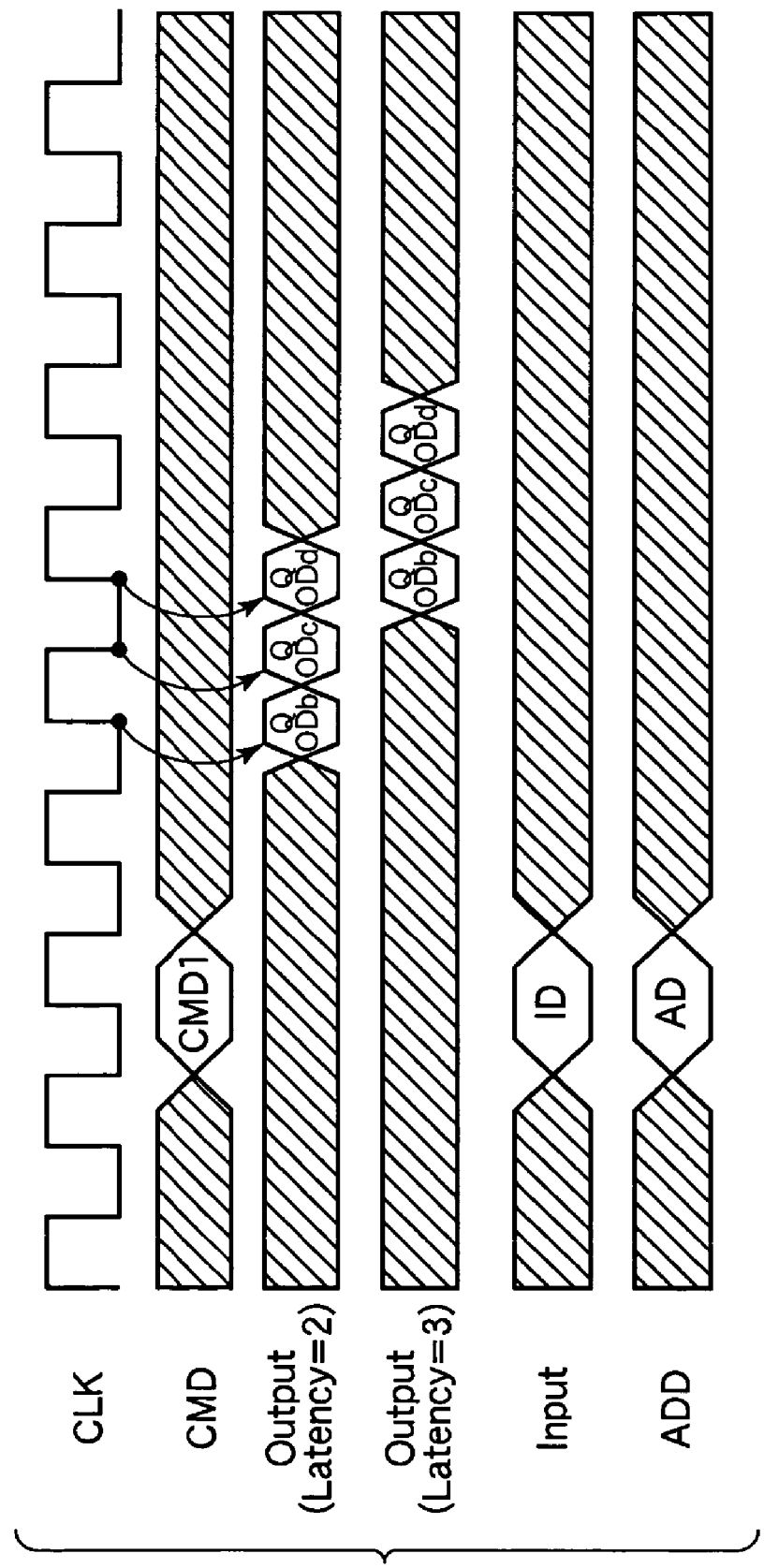
FIG. 16 is a diagram illustrating a second operation timing for the semiconductor memory device 1 of an embodiment according to the invention.

FIG. 16 depicts a second operation timing in the semiconductor memory device 1. The second operation timing is characterized in that data output at so-called DDR (double data rate) is carried out in which odd-numbered output of operation result data OD and even-numbered output of operation result data OD are continuously outputted in synchronization with the edges that are either one of the rising edge and the falling edge and different from each other, respectively. As shown in FIG. 16, for example, the odd-numbered outputs of the operation result data ODb and ODd are outputted in synchronization with the rising edge of the clock signal CLK, and the even-numbered outputs of the operation result data ODc are outputted in synchronization with the falling edge of the clock signal CLK. Thus, data output can be done in a half period of time compared with the case shown in FIG. 15 (so-called SDR (single data rate)).

Figure 17:
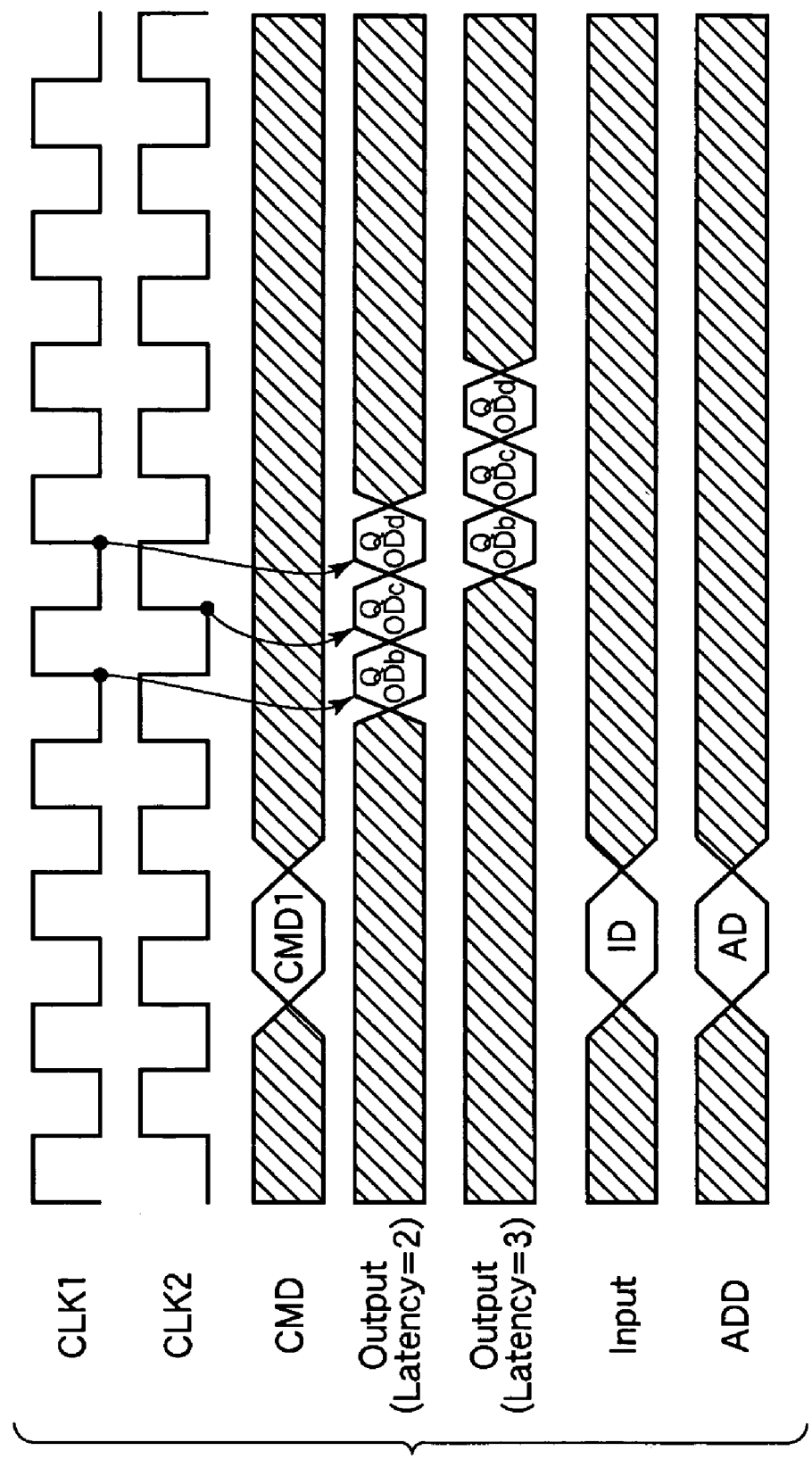
FIG. 17 is a diagram illustrating a third operation timing for the semiconductor memory device 1 of an embodiment according to the invention.

FIG. 17 depicts a third operation timing for the semiconductor memory device 1. The third operation timing is characterized in that odd-numbered output of the operation result data and even-numbered outputs are continuously outputted in synchronization with the clock signals that are either one of the clock signal CLK1 from the clock input unit 29 and the clock signal CLK2 which is inverted clock signal CLK1 and different from each other in the phase. As shown in FIG. 17, for example, the odd-numbered outputs of the operation result data ODb and ODd are outputted in synchronization with the rising edge of the clock signal CLK1, and the even-numbered outputs of the operation result data ODc are outputted in synchronization with the rising edge of the inverted, clock signal CLK2. Data output in the DDR mode is also done by this operation timing.

Figure 18:
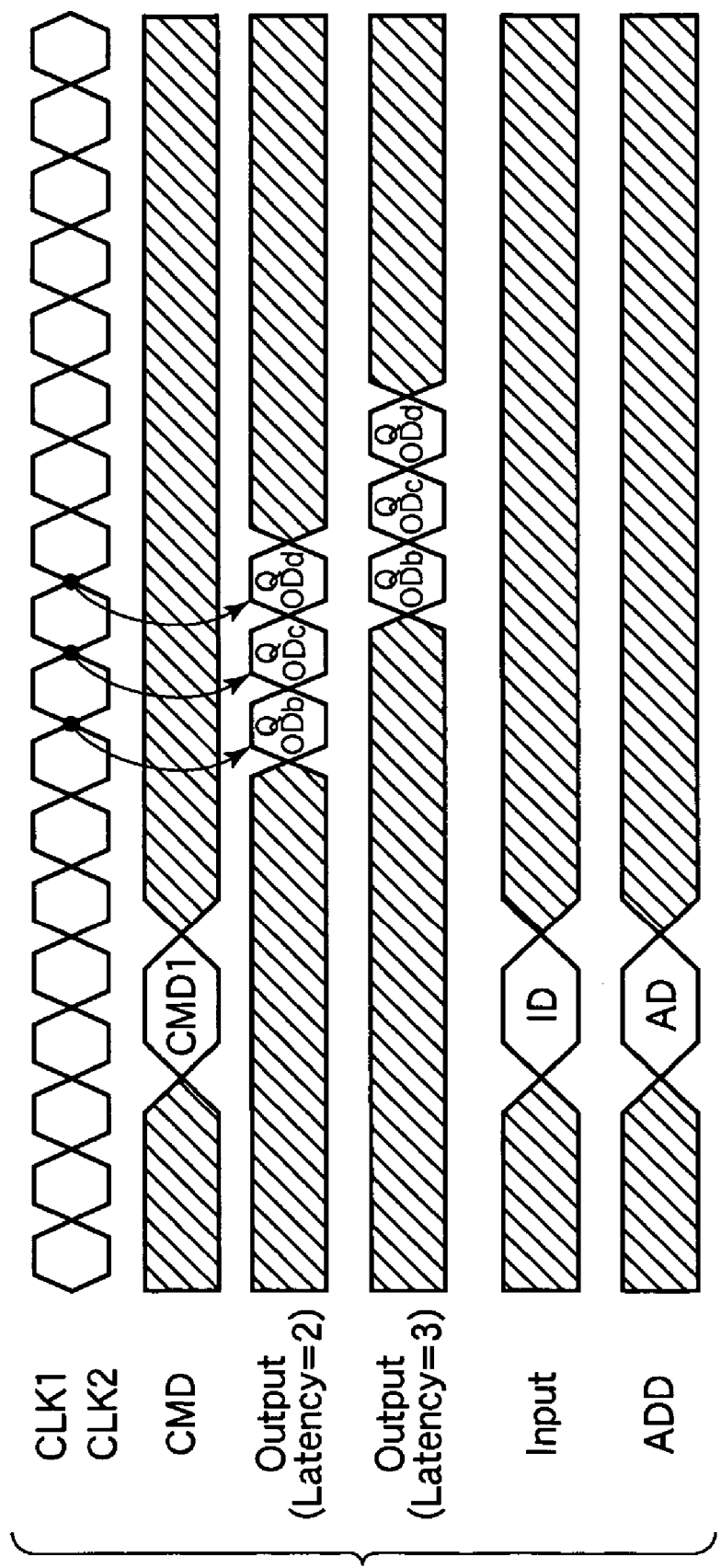
FIG. 18 is a diagram illustrating a fourth operation timing for the semiconductor memory device 1 of an embodiment according to the invention.

FIG. 18 depicts a fourth operation timing in the semiconductor memory device 1. The fourth operation timing is characterized in that odd-numbered outputs of the operation result data and even-numbered outputs of the operation result data are continuously outputted, respectively, in synchronization with either one of the first and the second intersections of the differential clock signals CLK1 and CLK2 and different from each other. As shown in FIG. 18, for example, the odd-numbered outputs of the operation result data ODb and ODd are outputted in synchronization with the first intersection where the rising edge of the clock signal CLK1 is intersected with the falling edge of the clock signal CLK2, and the even-numbered outputs of the operation result data ODc are outputted in synchronization with the second intersection where the falling edge of the clock signal CLK1 is intersected with the rising edge of the clock signal CLK2. Data output in the DDR mode is also done by this operation timing.

Figure 19:
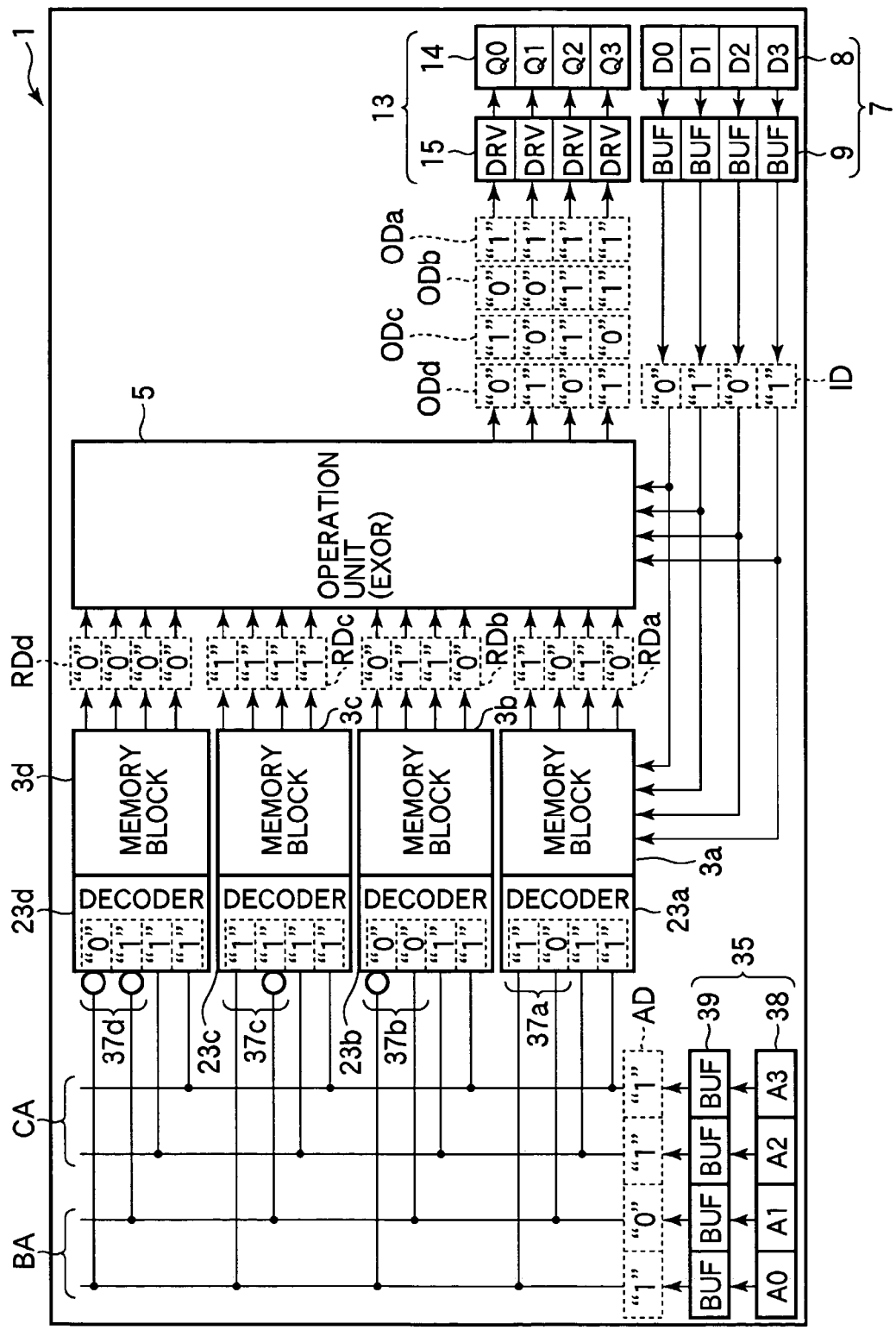
FIG. 19 is a diagram partially illustrating the schematic configuration of the semiconductor memory device 1 by a modification of an embodiment according to the invention.

Next, a modification of the semiconductor memory device 1 shown in FIG. 14 will be described with reference to FIG. 19. A first memory block 3a of the modification is used not only for writing input data but also for storing read data, and is characterized in that the read data RDa read out of the first memory block 3a and the input data ID are operated at the operation unit 5. The read data RDa is the data that has been already written (stored) in the first memory block 3a before the writing of the input data ID. In the semiconductor memory device 1 of the modification, the operation result data ODa, ODb, ODc, and ODd that are generated from the read data RDa read out of the first memory block 3a, the read data RDb, RDc and RDd readout of the second memory blocks 3b, 3c and 3d, and the input data ID are continuously outputted from the data output unit 13 to the outside in a predetermined order. The operation result data ODa, ODb, ODc and ODd are outputted at any of the operation timings shown in FIGS. 15 to 18.

Next, another modification of the semiconductor memory device 1 shown in FIG. 14 will be described with reference to FIGS. 20 and 21. The semiconductor memory device 1 of the modification is characterized in that a first memory block 3a and the second memory blocks 3b, 3c and 3d that are selected at the same time and can read data at the same time are activated with a predetermined delay time or clock delay. That predetermined delay time or predetermined clock delay are, for example, specified by a command at the time of initial setting.

Figure 20:
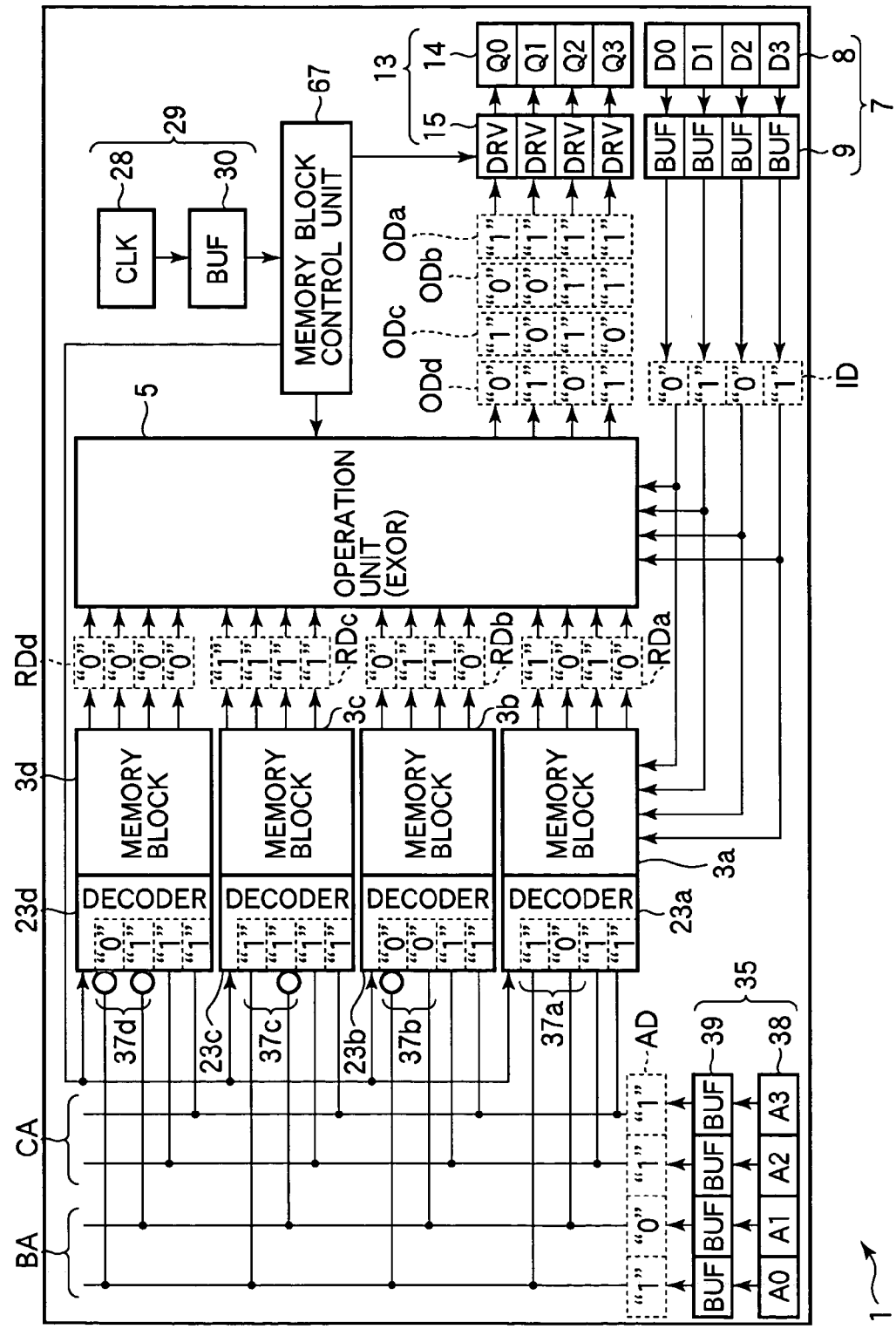
FIG. 20 is a diagram partially illustrating the schematic configuration of the semiconductor memory device 1 by another modification of an embodiment according to the invention.

FIG. 20 partially depicts the schematic configuration of the semiconductor memory device 1 of the modification. As shown in FIG. 20, the semiconductor memory device 1 of the modification has a memory block control unit 67 which controls an activating order of the first memory block 3a and the second memory blocks 3b, 3c and 3d, and an output order of the operation result data ODa, ODb, ODc and ODd. The memory block control unit 67 outputs a predetermined control signal that controls the activation of each of the memory blocks 3a, 3b, 3c and 3d and the output of the operation result data ODa, ODb, ODc and ODd. That predetermined control signal is outputted in synchronization with the clock signal CLK from the clock input unit 29, for example. The clock input unit 29 has a clock signal input terminal 28, and a clock buffer 30 which shapes the waveform of the inputted clock signal, for example.

Figure 21:
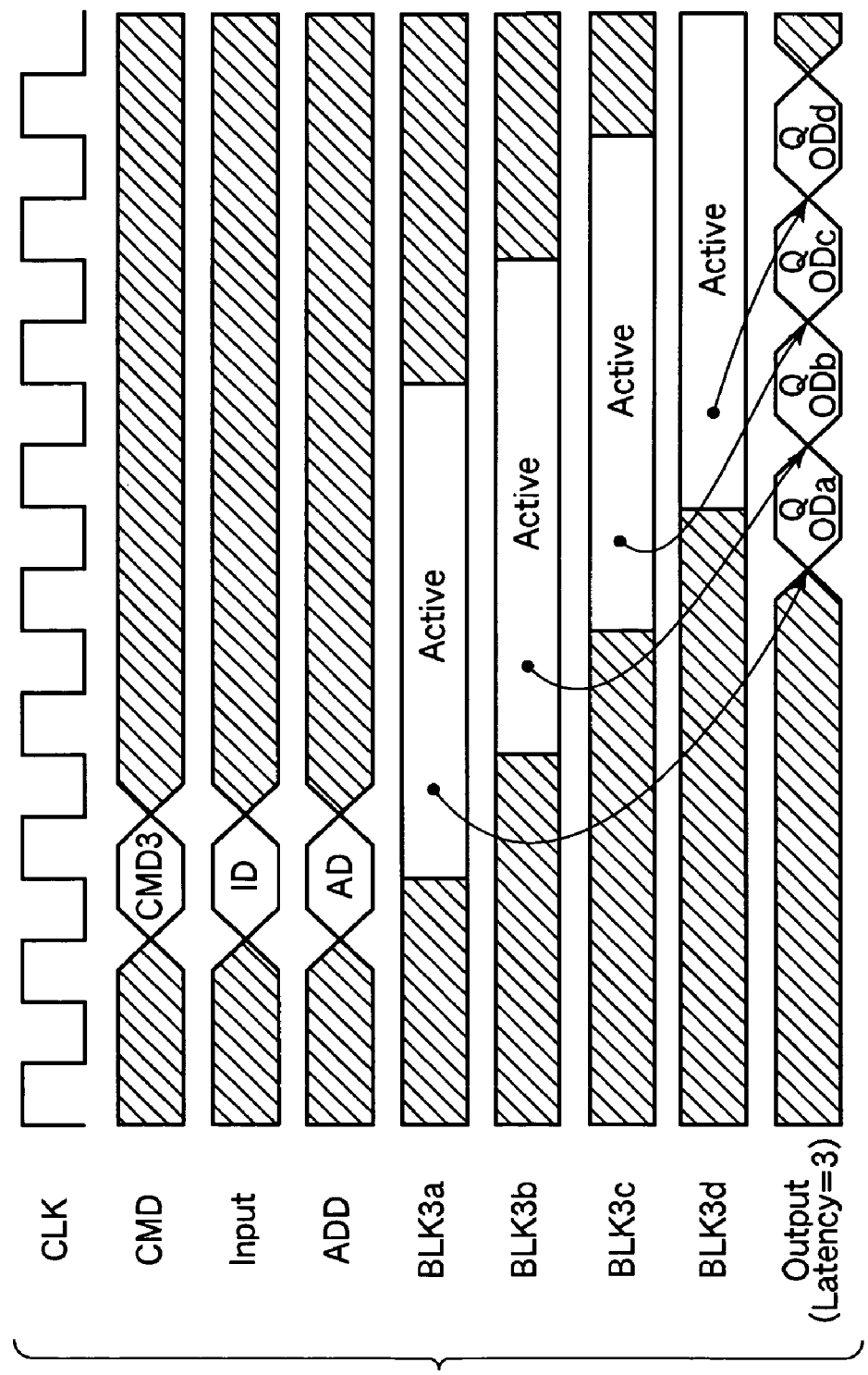
FIG. 21 is a diagram illustrating a fifth operation timing for the semiconductor memory device 1 of an embodiment according to the invention.

FIG. 21 depicts a fifth operation timing for the semiconductor memory device 1. In FIG. 21, from the upper row shown are the clock signal CLK from the clock input unit 29, the command (CMD) detected at a control unit 33 based on various control signals inputted to a command input unit 31, the input data (Input) inputted to a data input unit 7, the address (ADD) inputted to an address input unit 35, the first memory block 3a (BLK3a), the second memory blocks 3b, 3c and 3d (BLK3b, BLK3c, and BLK3d), and the output data (Output) where the clock delay is set to three (Latency=3).

As shown in FIG. 21, memory block activating command CMD3 that sequentially activates each of the memory blocks 3a, 3b, 3c and 3d, the input data ID associated with the memory block activating command CMD3 and the input data related address AD are latched at the same time at the rising edge of the clock signal CLK, and inputted into the semiconductor memory device 1. The first memory block 3a is activated (Active) by a predetermined control signal outputted from the memory block control unit 67 at the same time when the memory block activating command CMD3 is inputted, and outputs the read data RDa to an operation unit 5. Furthermore, the second memory blocks 3b, 3c and 3d are sequentially activated by a predetermined control signal sequentially outputted from the memory block control unit 67 in synchronization with the clock signal CLK, and sequentially output the read data RDb, RDc and RDd to the operation unit 5.

In FIG. 21, since the clock delay is set to three, the operation result data ODa resulted from the read data RDa and the input data ID is outputted as the output data Q from the data output unit 13 to the outside in synchronization with the clock signal CLK at the third clock after the memory block activating command CMD3 is latched. The operation result data ODb, ODc and ODd resulted from the read data RDb, RDc and RDd and the input data ID are continuously outputted as the output data Q with the operation result data ODa from the data output unit 13 to the outside in synchronization with the clock signal CLK. In addition, the output timing of the operation result data ODa, ODb, ODc and ODd is not limited to the clock delay, but may be set as the delay time.

Figure 22:
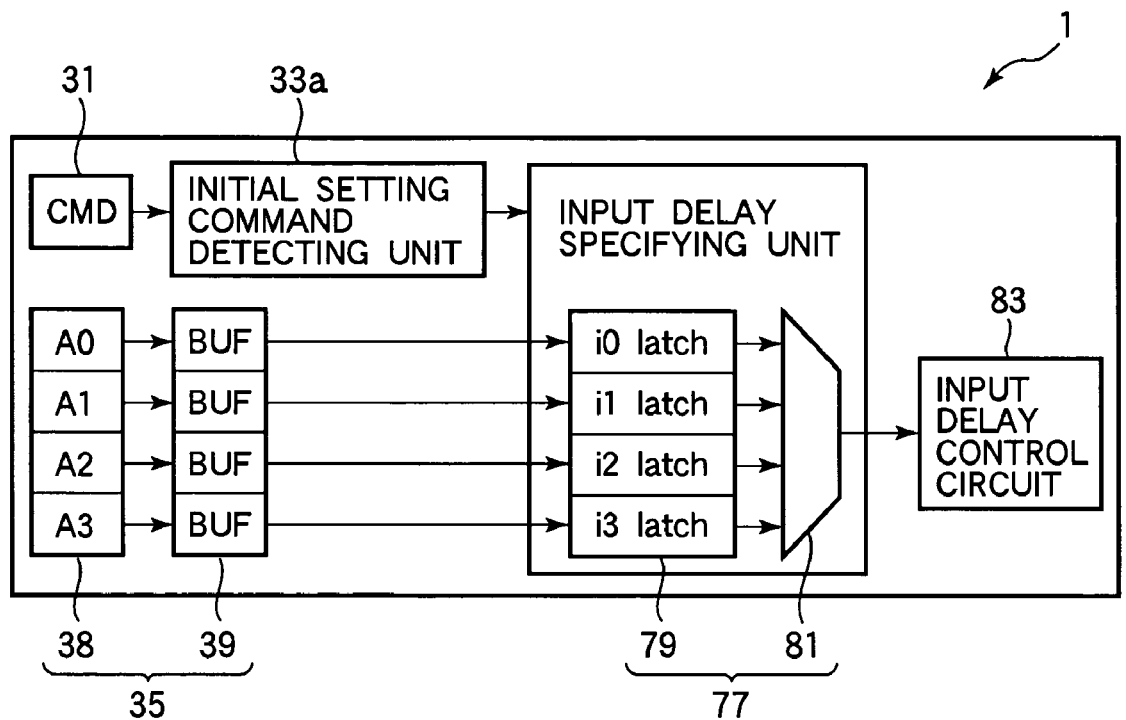
FIG. 22 is a diagram illustrating an input delay control unit equipped in the semiconductor memory device 1 of an embodiment according to the invention.
Figure 23:
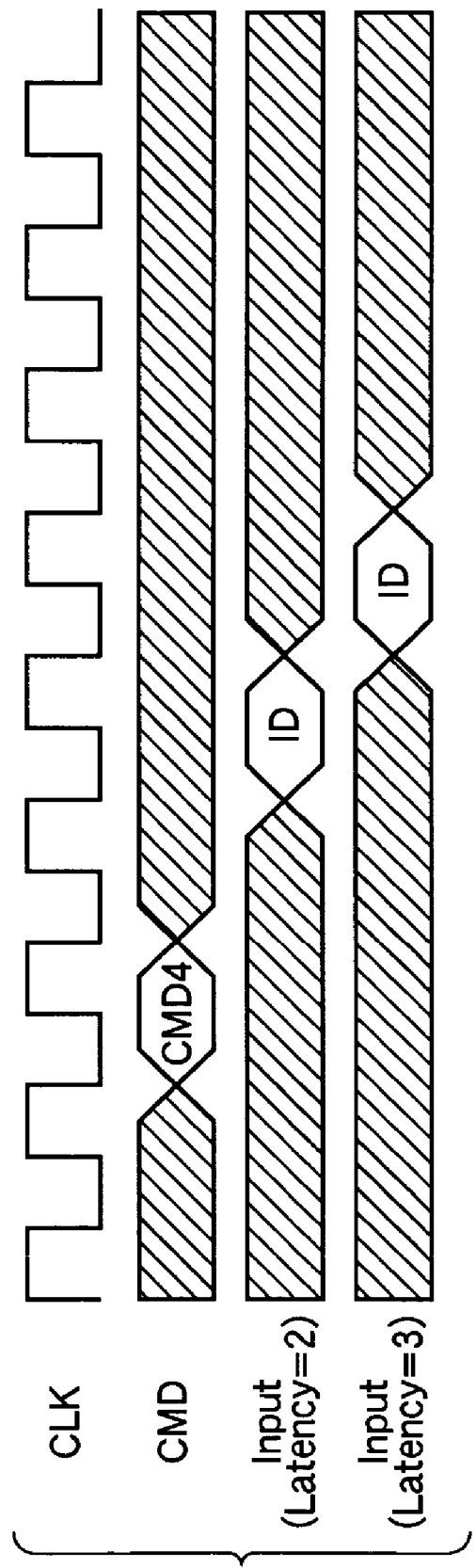
FIG. 23 is a diagram illustrating an exemplary input timing for input data Input of the semiconductor memory device 1 of an embodiment according to the invention.

Next, the input timing at which the input data ID is inputted to the semiconductor memory device 1 will be described with reference to FIGS. 22 and 23. FIG. 22 depicts the configuration of an input delay control unit which controls the input timing of input data. FIG. 23 depicts exemplary input timing of input data (Input). As shown in FIG. 22, the input delay control unit has an input delay specifying unit 77 which holds the input control address inputted to the address input unit 35 in association with the initial setting command that initially sets various operation modes of the semiconductor memory device 1 and specifies an input delay, and an input delay control circuit 83 which controls the input timing of input data based on an input delay signal from the input delay specifying unit 77. The input delay specifying unit 77 has an input control address holding unit 79 which latches and holds the input control address, and an input delay signal creating unit 81 which generates an input delay signal based on the input control address and outputs it to the input delay control circuit 83. The input control address holding unit 79 has multiple latch parts i0 to i3 (four parts in FIG. 22) so as to latch a plurality of input control addresses.

For example, in the semiconductor memory device 1, it is possible to input a command (input control command) that sets the input timing as one of initial setting commands. When the initial setting command detecting unit 33a detects the input control command from the combination of the logic levels of a plurality of the control signals inputted to the command input unit 31 at the time of initial setting, it controls the input delay specifying unit 77 so as to latch and hold the input control address inputted to the address input unit 35 nearly simultaneously as the control signals. Therefore, the input control address is held in the input delay control unit 77. The input delay specifying unit 77 outputs the input delay signal from the input delay signal creating unit 81 to the input delay control circuit 83 based on the held input control address. The input delay control circuit 83 controls the input timing of input data based on the input delay signal. The input timing of input data can be specified as the delay time or clock delay.

FIG. 23 depicts exemplary operation timing of the semiconductor memory device 1 when the input timing of input data is specified as the clock delay. In FIG. 23, from the upper row, shown are the clock signal CLK from the clock input unit 29, the command (CMD) detected at the control unit 33 based on various control signals inputted to the command input unit 31, and the input data (Input) inputted to the data input unit 7 where the clock delay is two (Latency=2) and three (Latency=3).

As shown in FIG. 23, when control command CMD4 is latched at the rising edge of the clock signal CLK and inputted into the semiconductor memory device 1, the input data ID is latched at the rising edge of the clock signal CLK after two clocks or three clocks from the input of the control command CMD4 and inputted into the semiconductor memory device 1. Moreover, when the input timing of the input data ID is specified as the delay time, the input data ID is inputted into the semiconductor memory device 1 after the specified delay time has elapsed from the input of the control command CMD4.

Figure 24:
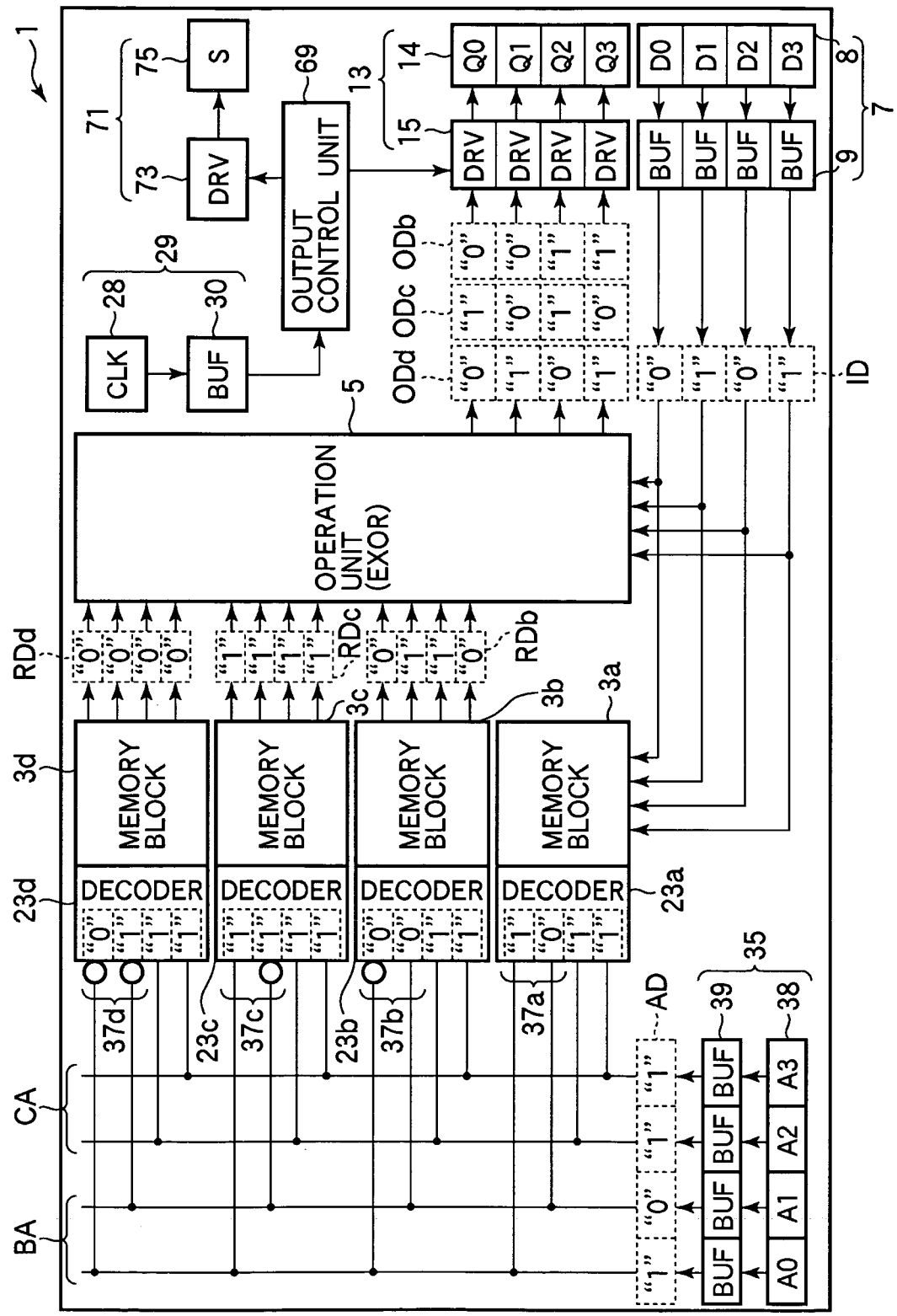
FIG. 24 is a diagram illustrating a reference clock signal output unit equipped in the semiconductor memory device 1 of an embodiment according to the invention.

Next, a reference clock signal that is outputted in synchronization with the operation result data will be described with reference to FIGS. 24 to 26. FIG. 24 partially depicts the schematic configuration of the semiconductor memory device 1 having a reference clock signal output unit which outputs the reference clock signal. As shown in FIG. 24, the semiconductor memory device 1 has an output control unit 69 which controls the output timing of the operation result data OD (in the drawing, ODb, ODc, and ODd are taken as an example) from the data output unit 13, and a reference clock signal output unit 71 which outputs reference clock signal S that is outputted from the output control unit 69 and synchronized with the output timing for the operation result data ODb, ODc and ODd.

The output control unit 69 controls the output data driver 15 based on the inputted clock signal CLK, and controls the output timing of the operation result data ODb, ODc and ODd as well as outputting the reference clock signal S that is synchronized with the output timing of the operation result data ODb, ODc and ODd to the reference clock signal output unit 71. When the delay time or clock delay is set to the operation result data ODb, ODc and ODd, the output control unit 69 delays the reference clock signal S from a predetermined command input by that delay time or clock delay and outputs it to the reference clock signal output unit 71.

The reference clock signal output unit 71 has a reference clock signal driver 73, and a reference clock signal output terminal 75. The reference clock signal S is outputted from the reference clock signal output terminal 75 in synchronization with the operation result data ODb, ODc and ODd. For example, the single reference clock signal S is outputted at every one byte (eight bits).

Next, the output timing of the reference clock signal S will be described with reference to FIGS. 25 and 26. FIG. 25 depicts exemplary a first output timing of the reference clock signal S, and FIG. 26 depicts exemplary a second output timing of the reference clock signal S. In FIGS. 25 and 26, from the upper row in the drawing, shown are the clock signal CLK from the clock input unit 29 (in FIG. 26, differential clock signals CLK1 and CLK2), the command (CMD) detected at the control unit 33 based on various control signals inputted to the command input unit 31, the output data (Output) where the clock delay is two (Latency=2), the reference clock signal S where the clock delay is two (Latency=2), the output data (Output) where the clock delay is three (Latency=3), the reference clock signal S where the clock delay is three (Latency=3), the input data (Input) inputted to the data input unit 7, and the address (ADD) inputted to the address input unit 35.

Figure 25:
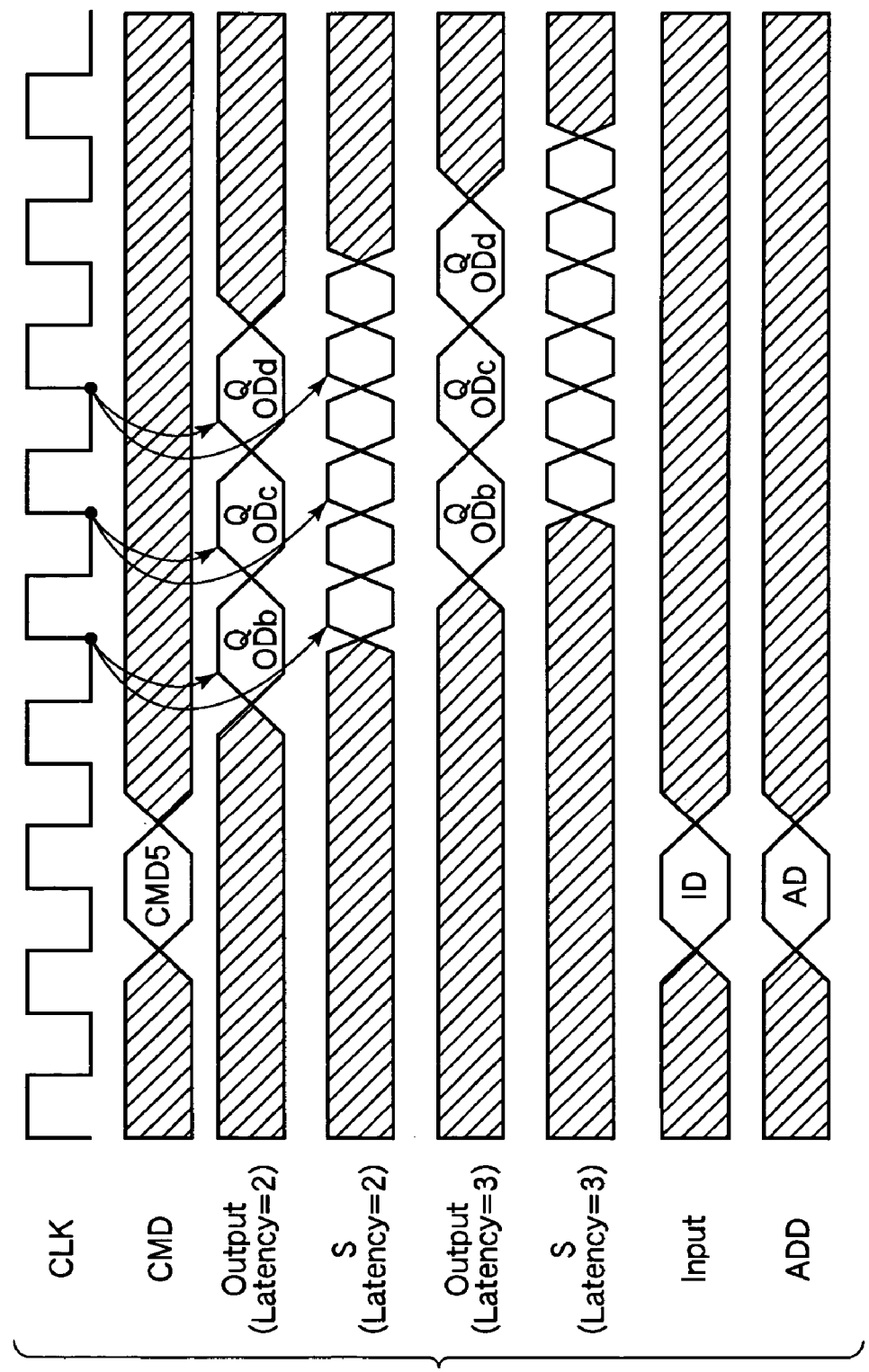
FIG. 25 is a diagram illustrating an exemplary first operation timing for reference clock signal S of the semiconductor memory device 1 of an embodiment according to the invention.

As shown in FIG. 25, at the first output timing, the reference clock signal S is outputted so that all items of the output data Q (the operation result data ODb, ODc and ODd) are synchronized only with either the rising edge of or the falling edge. Furthermore, the reference clock signal S is outputted with the set clock delay.

Figure 26:
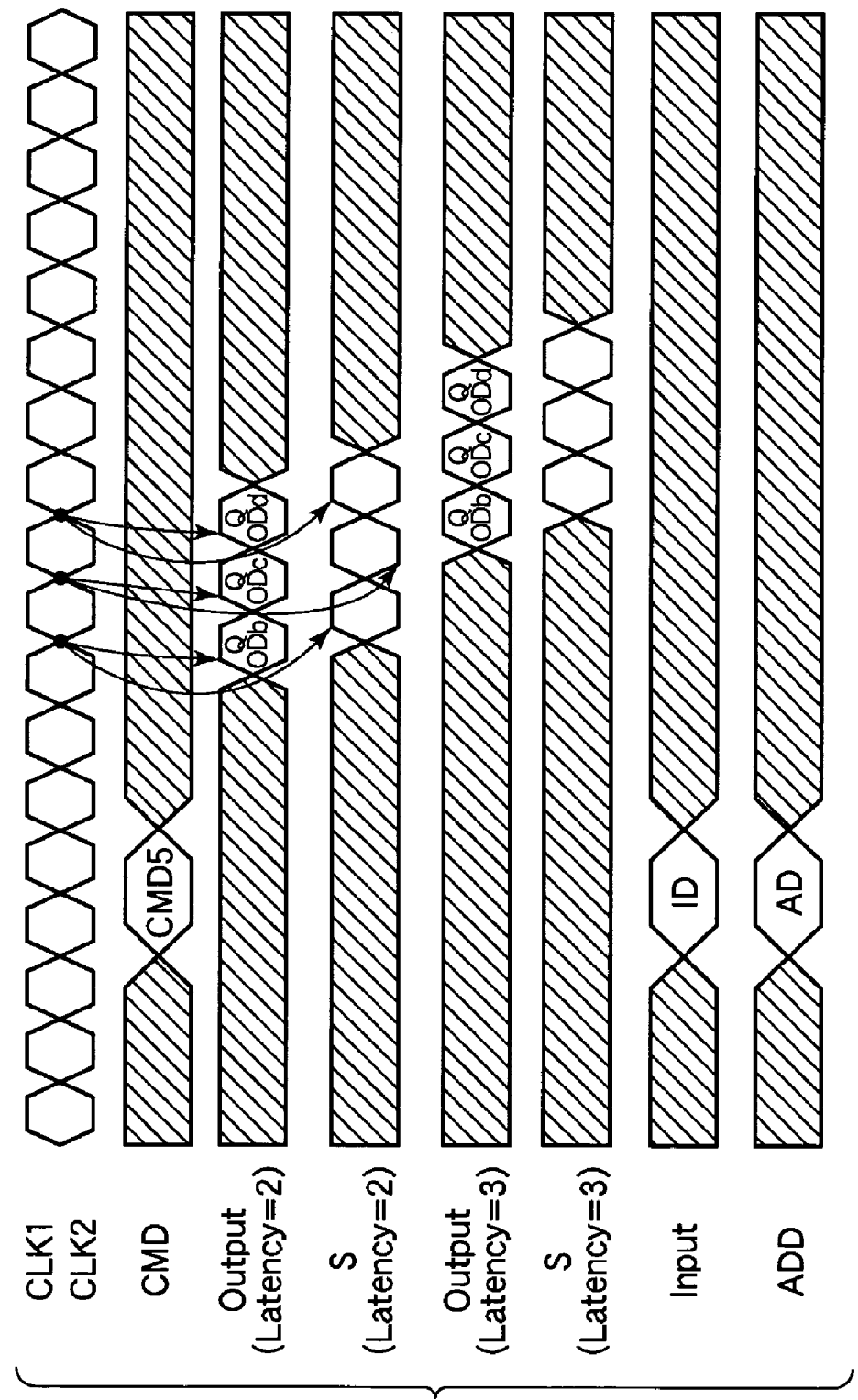
FIG. 26 is a diagram illustrating an exemplary second operation timing for reference clock signal S of the semiconductor memory device 1 of an embodiment according to the invention.

As shown in FIG. 26, at the second output timing, for example, the rising edge of the reference clock signal S is synchronized with the odd-numbered outputs of the output data Q (the operation result data ODb and ODd), and the falling edge thereof is synchronized with the even-numbered outputs of the output data Q (the operation result data ODc). Moreover, the reference clock signal S is outputted with the set clock delay. The second output timing is not limited to the timing shown in FIG. 26. The falling edge of the reference clock signal S may be synchronized with the odd-numbered outputs of the output data Q (the operation result data ODb and ODd), and the rising edge thereof may be synchronized with the even-numbered outputs of the output data Q (the operation result data ODc).

When a control unit is employed which utilizes at least one of the control methods of the semiconductor memory device shown in FIGS. 7, 15 to 18 and 21 to control the semiconductor memory device 1, a semiconductor integrated circuit system can be implemented in which the number of accesses to the semiconductor memory device 1 is reduced to decrease the load on the control unit. Furthermore, circuit board design to achieve the semiconductor integrated circuit system can be facilitated. Moreover, a semiconductor integrated circuit in which a control element that implements the control method of the semiconductor memory device shown in FIGS. 7, 15 to 18 and 21 and a semiconductor storage element that exerts the same function as that of the semiconductor memory device 1 are formed on a same circuit board can obtain the same advantages as those of the semiconductor integrated circuit system described above.

Figure 27:
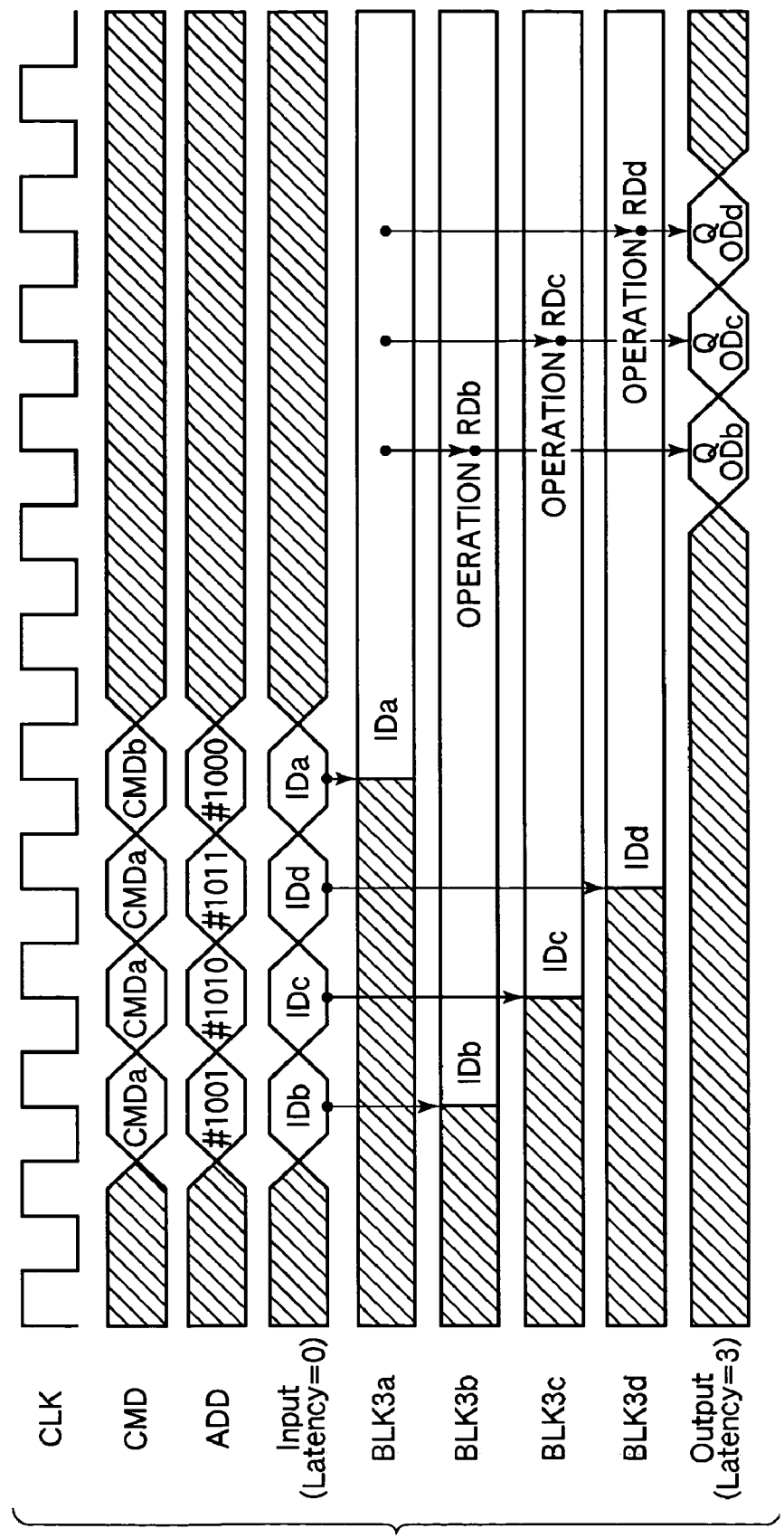
FIG. 27 is a diagram illustrating a sixth operation timing for the semiconductor memory device 1 of an embodiment according to the invention.

Next, another control method of the semiconductor memory device 1 will be described with reference to FIGS. 27 to 29. FIG. 27 is a timing chart illustrative of a sixth operation timing of the semiconductor memory device 1. In FIG. 27, from the upper row, shown are the clock signal CLK from the clock input unit 29, the command (CMD) detected at the control unit 33, the address (ADD) inputted to the address input unit 35, the input data (Input, Latency=0) inputted to the data input unit 7, respective logic memory blocks 3a, 3b, 3c and 3d (BLK3a, BLK3b, BLK3c, and BLK3d), and the output data (Output) where the clock delay is set to three (Latency=3).

As shown in FIG. 27, input data (first data) IDb, IDc and IDd each associated with non-operation command CMDa that does not permit the operation unit 5 to operate, and input data related addresses ADb (#1001), ADc (#1010) and ADd (#1011) associated with the input data IDb, IDc and IDd are sequentially inputted. Since the input timing of the input data ID is set to Latency=0, each of the input data IDb, IDc and IDd is written to the logic memory blocks 3b, 3c and 3d nearly simultaneously as inputted.

After the non-operation command CMDa is inputted three times, input data (second data) IDa associated with operation command CMDb that permits the operation unit 5 to do a predetermined operation and the input data related address ADa (#1000) associated with the input data IDa are inputted.

Since Latency=0 is set, the input data IDa is written to the logic memory block (first memory block) 3*a* nearly simultaneously as inputted and is outputted to the operation unit 5.

On the other hand, when the operation command CMDb is inputted, the logic memory blocks 3*b*, 3*c* and 3*d* are selected as the second memory blocks 3*b*, 3*c* and 3*d* by read addresses RAb, RAc and RAd generated based on the input data related address ADa (#1000) associated with the input data IDa, the stored input data IDb, IDc and IDd are outputted as the read data RDb, RDc and RDd to the operation unit 5. The operation unit 5 processes a predetermined operation for the read data RDb, RDc and RDd with the input data IDa, and the operation result data ODb, ODc and ODd are outputted.

The output timing of the output data Q (the operation result data ODb, ODc and ODd) is set to Latency=3. Thus, the operation result data ODb, ODc and ODd are continuously outputted in this order in synchronization with the rising edge of the clock signal CLK, for example, after three clocks from the input of the operation command CMDb. In addition, the output timing for the operation result data ODb, ODc and ODd can be set as the delay time.

Figure 28:
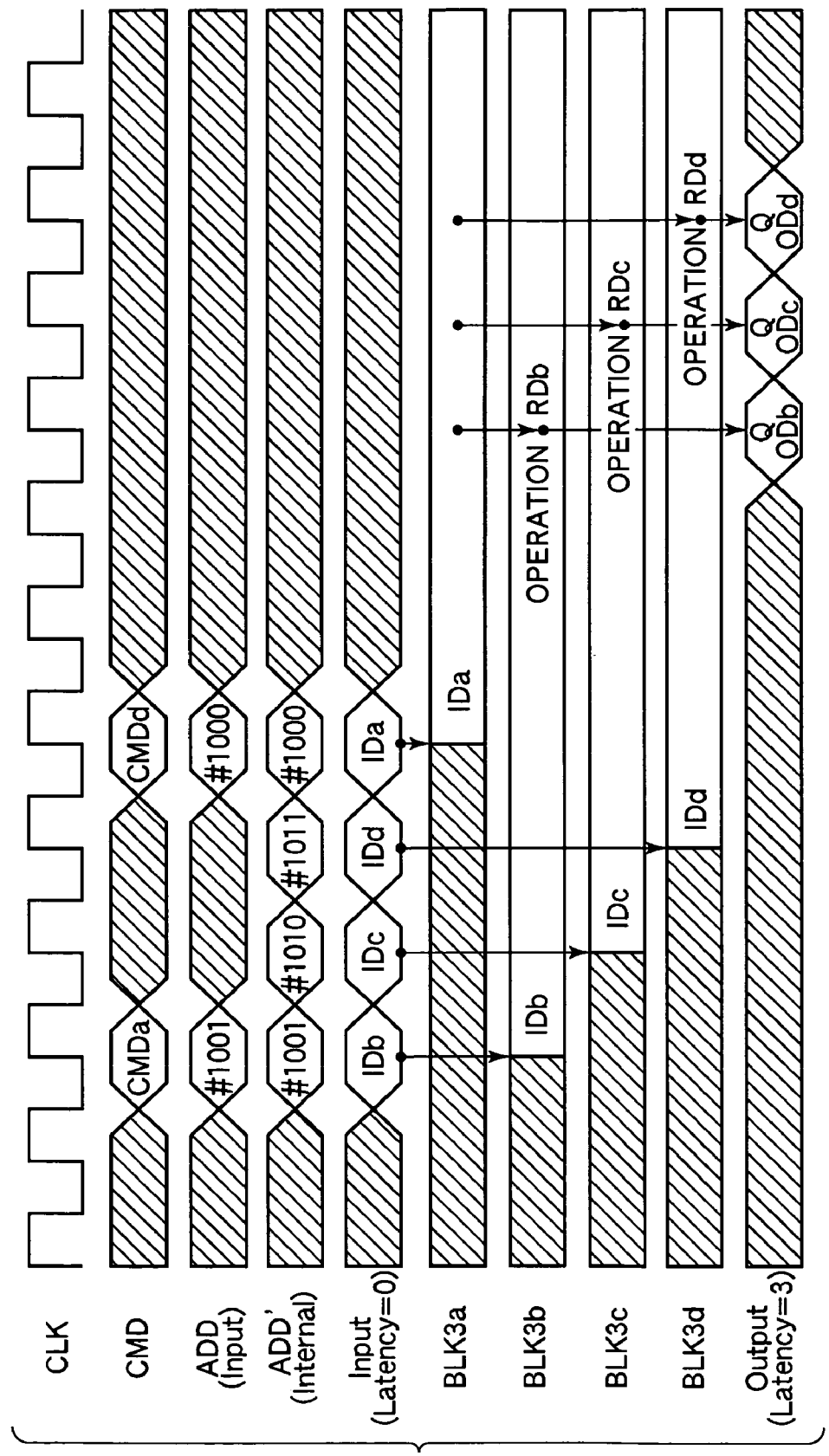
FIG. 28 is a diagram illustrating a seventh operation timing for the semiconductor memory device 1 of an embodiment according to the invention.

FIG. 28 is a timing chart illustrative of a seventh operation timing of the semiconductor memory device 1. In FIG. 28, from the upper row, shown are the clock signal CLK from the clock input unit 29, the command (CMD) detected at the control unit 33, the address (ADD) inputted to the address input unit 35, the internal address ADD' (Internal) that is generated by an address internal counter (not shown) based on the inputted address (ADD), the input data (Input, Latency=0) inputted to the data input unit 7, respective logic memory blocks 3*a* to 3*d* (BLK3*a* to BLK3*d*), and the output data (Output) where the clock delay is set to three (Latency=3).

As shown in FIG. 28, input data (first data) IDb associated with the non-operation command CMDa that does not permit the operation unit 5 to operate, and the input data related address ADb (#1001) associated with the input data IDb are inputted. The input data IDb is written to the logic memory block 3*b* selected by the input data related address ADb (#1001) with Latency=0. Subsequently, the address internal counter is counted up in synchronization with the clock signal CLK to generate internal address ADD' (#1010), and the input data (first data) IDc is written to the logic memory block 3*c* selected by the internal address ADD' (#1010). Then, internal address ADD' (#1011) is similarly generated by the address internal counter, and the input data (first data) IDd is written to the logic memory block 3*d* selected by the internal address ADD' (#1011).

Subsequently, the input data IDa associated with the operation command CMDb that permits the operation unit 5 to operate, and the input data related address ADa (#1000) associated with the input data IDa are inputted. Since Latency=0 is set, the input data (second data) IDa is written to the logic memory block (first memory block) 3*a* nearly simultaneously as inputted and is outputted to the operation unit 5.

On the other hand, when the operation command CMDb is inputted, the logic memory blocks 3*b*, 3*c* and 3*d* are selected as the second memory blocks 3*b*, 3*c* and 3*d* by the read addresses RAb, RAc and RAd generated based on the input data related address ADa (#1000) associated with the input data IDa, and they output the stored input data IDb, IDc and IDd as the read data RDb, RDc and RDd to the operation unit 5. The operation unit 5 processes a predetermined operation for the read data RDb, RDc and RDd with the input data IDa, and outputs the operation result data ODb, ODc and ODd.

The output timing of the output data Q (the operation result data ODb, ODc and ODd) is set to Latency=3. Thus, the operation result data ODb, ODc and ODd are continuously outputted in this order in synchronization with the rising edge of the clock signal CLK, for example, after three clocks from the input of the operation command CMDb. In addition, the output timing of the operation result data ODb, ODc and ODd can also be set as the delay time.

As described above, the non-operation command CMDa and the input data IDb and the input data related address ADb associated with the non-operation command CMDa are inputted only once, and then the input data IDc and IDd inputted subsequent to the input data IDb can also be written to the logic memory blocks 3*c* and 3*d*. The operation command CMDb is inputted after the burst period of the non-operation command CMDa has elapsed. The control method of the semiconductor memory device 1 by this operation timing is the same as the control method of the semiconductor memory device by the first operation timing except that the input data IDb, IDc and IDd are stored in the logic memory blocks 3*b*, 3*c* and 3*d* by the burst operation.

Figure 29:
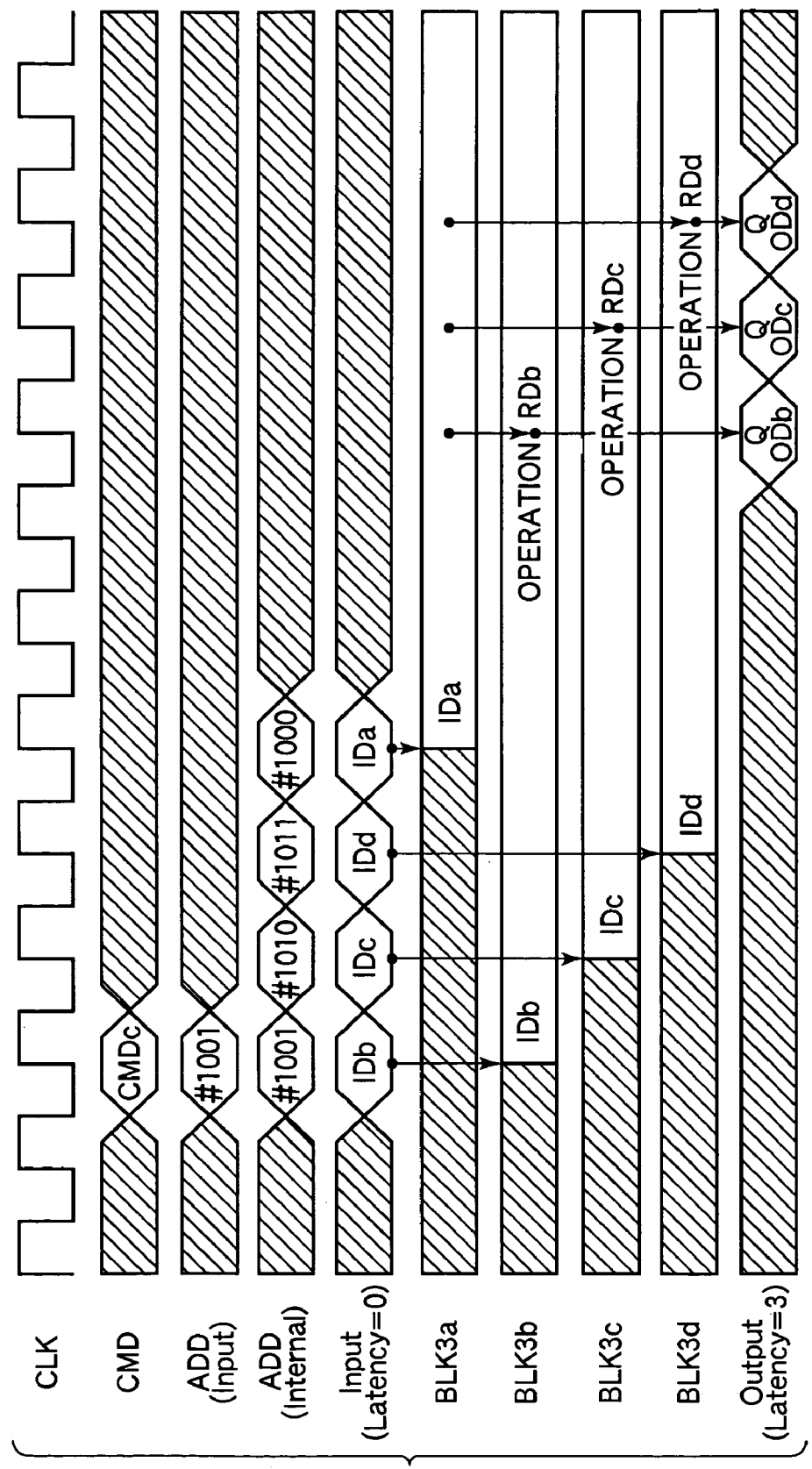
FIG. 29 is a diagram illustrating an eighth operation timing for the semiconductor memory device 1 of an embodiment according to the invention.

FIG. 29 is a timing chart illustrative of an eighth operation timing for the semiconductor memory device 1. The rows in FIG. 29 express the same as those in FIG. 28. The control method of the semiconductor memory device by this operation timing is characterized in that, instead of two types of commands (the non-operation command CMDa and the operation command CMDb) shown in FIG. 28, burst input operation command CMDc is inputted, and then input data is inputted by the burst operation to control an operation. The operation unit 5 is controlled so as to operate read data and input data inputted after the counting based on a predetermined bit number from the input of the burst input operation command CMDc.

As shown in FIG. 29, the input data (first data) IDb associated with the burst input operation command CMDc and input data related address AD (#1001) associated with the input data IDb are inputted. The input data IDb is written to the logic memory block 3*b* selected by the input data related address AD (#1001) with Latency=0. Subsequently, the address internal counter is counted up in synchronization with the clock signal CLK to generate internal address ADD' (#1010), and input data (first data) IDc is written to the logic memory block 3*c* selected by the internal address ADD' (#1010). Then, internal address ADD' (#1011) is similarly generated by the address internal counter, and input data (first data) IDd is written to the logic memory block 3*d* selected by the internal address ADD' (#1011).

Subsequently, internal address ADD' (#1000) is similarly generated by the address internal counter, and the input data (second data) IDa is written to the logic memory block (first memory block) 3*a*, selected by the internal address ADD' (#1000) and is outputted to the operation unit 5.

As described above, at this operation timing, a plurality of items of the input data ID are continuously inputted only by a predetermined burst length (in the embodiment, the burst length =4) in synchronization with the clock signal CLK.

On the other hand, the logic memory blocks 3*b*, 3*c* and 3*d* are selected as the second memory blocks 3*b*, 3*c* and 3*d* by the read addresses RAb, RAc and RAd generated based on the internal address ADD' (#1000) that writes the input data IDa, and outputs the stored input data IDb, IDc and IDd as the read data RDb, RDc and RDd to the operation unit 5. The operation unit 5 processes a predetermined operation for the read data RDb, RDc and RDd with the input data IDa, respectively, and outputs the operation result data ODb, ODc and ODd.

The output timing for the output data Q (the operation result data ODb, ODc and ODd) is set to Latency=3. Therefore, the operation result data ODb, ODc and ODd are continuously outputted in this order in synchronization with the rising edge of the clock signal CLK, for example, after three clocks from the input of the input data IDa. In addition, the output timing for the operation result data ODb, ODc and ODd can also be set as the delay time.

In the control method of the semiconductor memory device described above, a predetermined operation is done between the input data ID lastly inputted and the read data RD, but the input order of the input data ID operated with read data is not limited to the last position, but may be inputted in any position of the order.

Next, a control unit which implements anyone of the control methods of the semiconductor memory device shown in FIGS. 27 to 29, and the operation in a semiconductor integrated circuit system using the semiconductor memory device 1 will be described with reference to FIG. 30. The semiconductor integrated circuit system has a function that compresses elementary information and instruction information created by using decompression target information obtained from the elementary information and compression target information to create compressed information, and a function that decompress the decompression target information created from the instruction information extracted from the compressed information to decompress the compression target information. In the semiconductor integrated circuit system like this, the semiconductor memory device 1 is used for creation of decompression target information and for decompression of compression target information.

Figure 30:
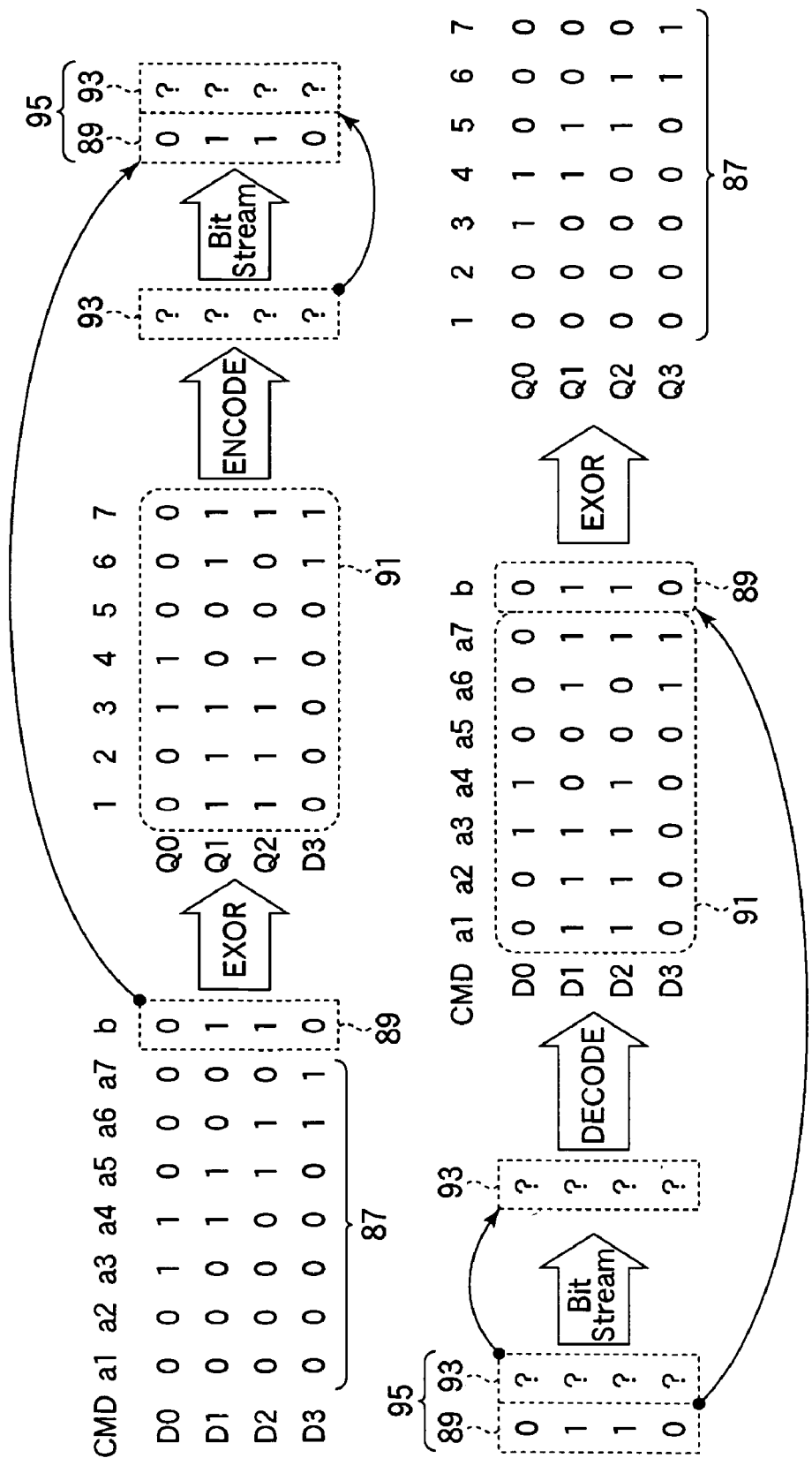
FIG. 30 is a diagram illustrating an exemplary flow of compression and decompression of an information group in a semiconductor integrated circuit system of an embodiment according to the invention.

FIG. 30 depicts an exemplary flow of compression and decompression of information groups in the semiconductor integrated circuit system. First, the compression of a predetermined information group will be described along the flow in the upper part in FIG. 30. To the semiconductor memory device 1 forming one component of the semiconductor integrated circuit system, information groups divided into compression target information 87 and elementary information 89 are inputted so that for example, the compression target information 87 is inputted in association with non-operation commands CMDa1 to CMDa7, and the elementary information 89 is then inputted in association with operation command CMDb. The semiconductor memory device 1 performs operation (EXORs) of the elementary information 89 and the compression target information 87 at the operation unit 5, and outputs decompression target information 91 as operation result data. The decompression target information 91 outputted from the semiconductor memory device 1 is inputted to an information compression device forming one component of the semiconductor integrated circuit system, for example. The information compression device creates (ENCODEs) instruction information 93, that is necessary for decompression, from the decompression target information 91, adds the elementary information 89 to the instruction information 93, and compresses them to create compressed information 95. Since the compressed information 95 has a smaller data capacity compared with the compression target information 87, the transfer and storage of the information groups are facilitated.

Next, the decompression of a predetermined information group will be described along the lower part in FIG. 30. The information compression device takes the instruction information 93 and elementary information 89 that are necessary for decompression, out of the compressed information 95, and creates (DECODEs) the decompression target information 91 from the instruction information 93. To the semiconductor memory device 1, the decompression target information 91 associated with the non-operation command CMDa1 to CMDa7 and the elementary information 89 associated with the operation command CMDb are inputted in this order. The semiconductor memory device 1 performs operation (EXORS) of the elementary information 89 and the decompression target information 91 at the operation unit 5, and decompresses and outputs the compression target information 87 as the operation result data.

As described above, in the semiconductor integrated circuit system using the semiconductor memory device 1, since a predetermined operation can be done without reading out stored information group to the outside of the semiconductor memory device 1, the number of accesses to the semiconductor memory device 1 is reduced to realize high-speed information processing. The information group to be a compression target processed in the semiconductor integrated circuit system is, for example, image information in which the same frames are closely arranged, or similar image information of continuous frames. In addition, the decompression target information to be processed in the semiconductor integrated circuit system is, for example, image information in which same frames are closely arranged, or similar image information of continuous frames.

A semiconductor integrated circuit in which a control element that implements any one of the control methods of the semiconductor memory device in FIGS. 27 to 29 and a semiconductor storage element that exerts the same function as that of the semiconductor memory device 1 are formed on the same circuit board can obtain the same advantages as those of the semiconductor integrated circuit system by transmitting data with an information compression circuit that exerts the same function as that of the information compression device.

What is claimed is:

1. A semiconductor memory device comprising:
    a data input unit to which input data is inputted from an outside of the semiconductor memory device;
    a memory unit in which data is stored;
    an operation unit processing a predetermined operation on the input data and read data read out from the memory unit;
    a data output unit outputting operation result data obtained by the operation unit to the outside; and
    a control unit detecting a non-operation command and an logical operation command,
    wherein, when the non-operation command is detected, a first address and first input data is supplied, the first data is stored into the memory unit based on the first address and the operation unit does not process the predetermined logical operation, and
    when the logical operation command is detected, a second address and second data are supplied, the first data is read from the memory based on the second address and the operation unit process the predetermined logical operation on the first data and the second data.

2. The semiconductor memory device according to claim 1, further comprising an address input unit to which an input data related address associated with the input data is inputted.

3. The semiconductor memory device according to claim 2, wherein a part of read address with which the read data is read out from the memory unit is not matched with a part of the input data related address.

4. The semiconductor memory device according to claim 3, wherein the memory unit is configured of a plurality of logic memory blocks, and
    the plurality of logic memory blocks includes:
        a first memory block which is selected using the part of the input data related address as a block select address and in which the input data is stored with the input data related address; and a second memory block which is selected using the part of the read address as a block select address and in which the read data is read out with the read address.

5. The semiconductor memory device according to claim 4, wherein a plurality of the second memory blocks are selected using a plurality of bits of the block select address.

6. The semiconductor memory device according to claim 5, wherein the operation unit operates a plurality of items of the read data read out from the plurality of the second memory blocks and the input data, and continuously outputs the operation result data resulted therefrom in a predetermined order.

7. The semiconductor memory device according to claim 6, wherein prior to storing the input data, the operation unit processes the operation of the read data read out from the input data related address in the first memory block and the input data.

8. The semiconductor memory device according to claim 7, wherein the operation unit continuously outputs operation result data resulted from the input data and the plurality of the read data read out from the plurality of the second memory blocks, and operation result data resulted from the input data and read data read out from the first memory block, in a predetermined order.

9. The semiconductor memory device according to claim 1, wherein the operation unit is capable of processing a plurality of types of operation.

10. The semiconductor memory device according to claim 9, wherein the operation unit specifies one of the plurality of types of operation by an operation select address inputted from the address input unit in association with an initial setting command that initially sets the semiconductor memory device.

11. The semiconductor memory device according to claim 6, further comprising a memory block control unit controlling the order of activating the first memory block and a plurality of the second memory blocks, and the order of outputting the operation result data.

12. The semiconductor memory device according to claim 1, further comprising:
an output control unit controlling the output timing of the operation result data outputted from the data output unit; and
a reference clock signal output unit outputting a reference clock signal that is synchronized with the output timing of the operation result data.

13. The semiconductor memory device according to claim 1, further comprising an output delay control unit delaying the output timing of the operation result data from the data output unit based on an output control address inputted from the address input unit in association with an initial setting command that initially sets the semiconductor memory device.

14. The semiconductor memory device according to claim 1, further comprising an input delay specifying unit delaying the input timing of the input data to the operation unit based on an input control address inputted from the address input unit in association with an initial setting command that initially sets the semiconductor memory device.

15. The semiconductor memory device according to claim 1, comprising a data input/output unit which is formed to share the data input unit and the data output unit.

16. A control method of a semiconductor memory device comprising:
storing in a memory unit a first data, which is inputted from an outside of the semiconductor memory device in association with a first address and a non-operation command that does not permit an operation unit to operate, based on the first address;
inputting from the outside a second data associated with a second address and an operation command that permits the operation unit to process a predetermined logical operation;
based on the operation command, operating the second data and the first data read out from the memory unit based on the second address at the operation unit; and
outputting operation result data obtained by the operation after a predetermined time period has elapsed from the input of the operation command.

17. The control method of a semiconductor memory device according to claim 16, wherein, instead of inputting the non-operation command and the operation command,
inputting a predetermined process command;
storing in the memory unit first data inputted from the outside in association with the predetermined process command;
inputting the second data after a predetermined time period from the input of the process command; and
operating the second data and the first data at the operation unit.

* * * * *